(12) United States Patent
Liu et al.

(10) Patent No.: US 12,374,296 B2
(45) Date of Patent: Jul. 29, 2025

(54) SHIFT REGISTER, DRIVING CIRCUIT, DRIVING METHOD AND DISPLAY DEVICE

(71) Applicants: Beijing BOE Technology Development Co., Ltd., Beijing (CN); BOE Technology Group Co., Ltd., Beijing (CN)

(72) Inventors: Weixing Liu, Beijing (CN); Wanpeng Teng, Beijing (CN); Zhiqiang Xu, Beijing (CN); Chunfang Zhang, Beijing (CN); Meirong Lu, Beijing (CN); Jintao Peng, Beijing (CN); Xinxing Wang, Beijing (CN); Huanhuan Wang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/687,937

(22) PCT Filed: Aug. 22, 2023

(86) PCT No.: PCT/CN2023/114227
§ 371 (c)(1),
(2) Date: Feb. 29, 2024

(87) PCT Pub. No.: WO2025/039184
PCT Pub. Date: Feb. 27, 2025

(65) Prior Publication Data
US 2025/0069554 A1    Feb. 27, 2025

(51) Int. Cl.
G09G 3/3266    (2016.01)
G09G 3/3233    (2016.01)
G11C 19/28    (2006.01)

(52) U.S. Cl.
CPC ......... G09G 3/3266 (2013.01); G09G 3/3233 (2013.01); *G09G 2300/0819* (2013.01);
(Continued)

(58) Field of Classification Search
CPC ............... G09G 3/3266; G09G 3/3233; G09G 2300/0819; G09G 2300/0842; G09G 2310/0286; G09G 2310/08; G11C 19/287
See application file for complete search history.

(56) References Cited

FOREIGN PATENT DOCUMENTS

CN        113763886 A    * 12/2021

* cited by examiner

*Primary Examiner* — Stacy Khoo
(74) *Attorney, Agent, or Firm* — Westman, Champlin & Koehler, P.A.

(57) ABSTRACT

A shift register, a driving circuit, a driving method and a display device are provided. The shift register includes: an input circuit configured to provide a first voltage or a second voltage to a first node and a light-emitting control signal terminal under control of a first input signal and a second input signal; a processing circuit configured to provide the first voltage or the second voltage to a second node under control of the first input signal and a potential of the first node; and an output circuit configured to provide the first voltage or the second voltage to a first output scanning signal terminal under control of a first clock signal and the potential of the first node, and provide the first voltage or the second voltage to a second output scanning signal terminal under control of a potential of the first output scanning signal terminal.

20 Claims, 20 Drawing Sheets

(52) U.S. Cl.
CPC ............ *G09G 2300/0842* (2013.01); *G09G 2310/0286* (2013.01); *G09G 2310/08* (2013.01); *G11C 19/287* (2013.01)

200a

200b

SHIFT REGISTER, DRIVING CIRCUIT, DRIVING METHOD AND DISPLAY DEVICE

CROSS-REFERENCE TO RELATED APPLICATION(S)

This application is a Section 371 National Stage Application of International Application No. PCT/CN2023/114227, filed on Aug. 22, 2023, entitled "SHIFT REGISTER, DRIVING CIRCUIT, DRIVING METHOD AND DISPLAY DEVICE", the content of which is incorporated herein by reference in its entirety.

TECHNICAL FIELD

The present disclosure relates to a field of display technology, in particular to a shift register, a driving circuit, a driving method and a display device.

BACKGROUND

In fields of light-emitting diode (LED) display and organic light-emitting diode (OLED) display, a display is driven to display by gate on array (GOA) circuits integrated on an array substrate and a timing design. A pixel circuit in the display generally requires a plurality of groups of GOA circuits to provide driving signals, so that spaces occupied by the GOA circuits are increased and it is difficult to effectively reduce a border width and meet requirements of a narrow border of the display.

SUMMARY

The present disclosure provides a shift register, a driving circuit, a driving method and a display device.

According to a first aspect, the present disclosure provides a shift register including: an input circuit electrically connected to a first input signal terminal, a second input signal terminal, a first power supply terminal, a second power supply terminal, and a light-emitting control signal terminal, and configured to provide a first power supply voltage of the first power supply terminal or a second power supply voltage of the second power supply terminal to a first node under a control of a first input signal from the first input signal terminal and a second input signal from the second input signal terminal, where the light-emitting control signal terminal is electrically connected to the first node; a processing circuit electrically connected to the first input signal terminal, the first node, the first power supply terminal, and the second power supply terminal, and configured to provide the first power supply voltage or the second power supply voltage to a second node under a control of the first input signal and a potential of the first node, where the input circuit is electrically connected to the second node, where the input circuit is electrically connected to the second node, and the input circuit provides the first power supply voltage or the second power supply voltage to the light-emitting control signal terminal under a control of a potential of the second node; and an output circuit electrically connected to a first clock signal terminal, the first node, the first power supply terminal, the second power supply terminal, a first output scanning signal terminal, and a second output scanning signal terminal, and configured to provide the first power supply voltage or the second power supply voltage to the first output scanning signal terminal under a control of a first clock signal from the first clock signal terminal and the potential of the first node, and provide the first power supply voltage or the second power supply voltage to the second output scanning signal terminal under a control of a potential of the first output scanning signal terminal.

For example, the input circuit includes: a first input sub-circuit electrically connected to the first input signal terminal, the second input signal terminal, the first power supply terminal and the light-emitting control signal terminal, and configured to provide the first power supply voltage to the light-emitting control signal terminal under the control of the first input signal and the second input signal; and a second input sub-circuit electrically connected to the second input signal terminal, the second power supply terminal and the light-emitting control signal terminal, and configured to provide the second power supply voltage to the light-emitting control signal terminal under the control of the second input signal.

For example, the first input sub-circuit includes a first transistor, a second transistor and a third transistor. A control electrode of the first transistor is electrically connected to the first input signal terminal, a first electrode of the first transistor is electrically connected to the second input signal terminal, and a second electrode of the first transistor is electrically connected to a control electrode of the third transistor. A control electrode of the second transistor is electrically connected to the second input signal terminal, a first electrode of the second transistor is electrically connected to the first power supply terminal, and a second electrode of the second transistor is electrically connected to a first electrode of the third transistor. The control electrode of the third transistor and the second electrode of the first transistor are electrically connected to the second node, and a second electrode of the third transistor and the light-emitting control signal terminal are electrically connected to the first node.

For example, the second input sub-circuit includes a fourth transistor and a fifth transistor. A control electrode of the fourth transistor is electrically connected to the second input signal terminal, a first electrode of the fourth transistor is electrically connected to the second power supply terminal, and a second electrode of the fourth transistor and the light-emitting control signal terminal are electrically connected to the first node; and a control electrode of the fifth transistor and the first input sub-circuit are electrically connected to the second node, a first electrode of the fifth transistor is electrically connected to the second power supply terminal, and a second electrode of the fifth transistor and the light-emitting control signal terminal are electrically connected to the first node.

For example, the processing circuit includes: a first processing sub-circuit electrically connected to the first node, the second node and the second power supply terminal, and configured to provide the second power supply voltage to the second node under the control of the potential of the first node; and a second processing sub-circuit electrically connected to the first input signal terminal, the first node, the second node and the first power supply terminal, and configured to provide the first power supply voltage to the second node under the control of the potential of the first node and the first input signal.

For example, the first processing sub-circuit includes a sixth transistor, where a control electrode of the sixth transistor is electrically connected to the first node, a first electrode of the sixth transistor is electrically connected to the second power supply terminal, and a second electrode of the sixth transistor is electrically connected to the second node.

For example, the second processing sub-circuit includes a seventh transistor and an eighth transistor. A control electrode of the seventh transistor is electrically connected to the first input signal terminal, a first electrode of the seventh transistor is electrically connected to the first power supply terminal, and a second electrode of the seventh transistor is electrically connected to a first electrode of the eighth transistor; and a control electrode of the eighth transistor is electrically connected to the first node, and a second electrode of the eighth transistor and the first processing sub-circuit are electrically connected to the second node.

For example, the output circuit includes: a first output sub-circuit electrically connected to the first clock signal terminal, the first node, the first power supply terminal, the second power supply terminal and the first output scanning signal terminal, and configured to provide the first power source voltage or the second power supply voltage to the first output scanning signal terminal under the control of the first clock signal and the potential of the first node; and a second output sub-circuit electrically connected to the first output scanning signal terminal, the first power supply terminal, the second power supply terminal, and the second output scanning signal terminal, and configured to provide the first power supply voltage or the second power supply voltage to the second output scanning signal terminal under the control of the potential of the first output scanning signal terminal.

For example, the first output sub-circuit includes a ninth transistor, a tenth transistor, an eleventh transistor and a twelfth transistor. A control electrode of the ninth transistor is electrically connected to the first clock signal terminal, a first electrode of the ninth transistor is electrically connected to the first power supply terminal, and a second electrode of the ninth transistor is electrically connected to the first output scanning signal terminal. A control electrode of the tenth transistor is electrically connected to the first clock signal terminal, a first electrode of the tenth transistor is electrically connected to a second electrode of the eleventh transistor, and a second electrode of the tenth transistor is electrically connected to the first output scanning signal terminal. A control electrode of the eleventh transistor is electrically connected to the first node, and a first electrode of the eleventh transistor is electrically connected to the second power supply terminal. A control electrode of the twelfth transistor is electrically connected to the first node, a first electrode of the twelfth transistor is electrically connected to the first power supply terminal, and a second electrode of the twelfth transistor is electrically connected to the first output scanning signal terminal.

For example, the second output sub-circuit includes a thirteenth transistor and a fourteenth transistor. A control electrode of the thirteenth transistor is electrically connected to the first output scanning signal terminal, a first electrode of the thirteenth transistor is electrically connected to the first power supply terminal, and a second electrode of the thirteenth transistor is electrically connected to the second output scanning signal terminal. A control electrode of the fourteenth transistor is electrically connected to the first output scanning signal terminal, a first electrode of the fourteenth transistor is electrically connected to the second power supply terminal, and a second electrode of the fourteenth transistor is electrically connected to the second output scanning signal terminal.

For example, the shift register further includes: a first control circuit electrically connected to a second clock signal terminal, the first output scanning signal terminal, the second output scanning signal terminal, a third output scanning signal terminal and a fourth output scanning signal terminal, and configured to provide the potential of the first output scanning signal terminal to the third output scanning signal terminal and provide a potential of the second output scanning signal terminal to the fourth output scanning signal terminal under a control of the second clock signal from the second clock signal terminal.

For example, the first control circuit includes a fifteenth transistor and a sixteenth transistor. A control electrode of the fifteenth transistor is electrically connected to the second clock signal terminal, a first electrode of the fifteenth transistor is electrically connected to the second output scanning signal terminal, and a second electrode of the fifteenth transistor is electrically connected to the fourth output scanning signal terminal. A control electrode of the sixteenth transistor is electrically connected to the second clock signal terminal, a first electrode of the sixteenth transistor is electrically connected to the first output scanning signal terminal, and a second electrode of the sixteenth transistor is electrically connected to the third output scanning signal terminal.

For example, the shift register further includes: a second control circuit electrically connected to a third clock signal terminal, the input circuit, the first input signal terminal and the second input signal terminal, and configured to provide the first input signal and the second input signal to the input circuit under a control of the third clock signal from the third clock signal terminal. The first input signal terminal and the second input signal terminal are electrically connected to the input circuit through the second control circuit.

For example, the second control circuit includes a seventeenth transistor, an eighteenth transistor, a nineteenth transistor and a twentieth transistor. A control electrode of the seventeenth transistor is electrically connected to the third clock signal terminal, a first electrode of the seventeenth transistor is electrically connected to the first input signal terminal, and a second electrode of the seventeenth transistor and the input circuit are electrically connected to a third node. A control electrode of the eighteenth transistor is electrically connected to the third clock signal terminal, a first electrode of the eighteenth transistor is electrically connected to the second input signal terminal, and a second electrode of the eighteenth transistor and the input circuit are electrically connected to the third node. A control electrode of the nineteenth transistor is electrically connected to the third clock signal terminal, a first electrode of the nineteenth transistor is electrically connected to the first input signal terminal, and a second electrode of the nineteenth transistor and the input circuit are electrically connected to a fourth node. A control electrode of the twentieth transistor is electrically connected to the third clock signal terminal, a first electrode of the twentieth transistor is electrically connected to the second input signal terminal, and a second electrode of the twentieth transistor and the input circuit are electrically connected to the fourth node.

According to a second aspect, the present disclosure provides a driving circuit including M shift registers provided in an embodiment of the present disclosure, where the M shift registers are cascaded and M is a positive integer greater than 1. A first input signal terminal of an $m^{th}$ shift register is electrically connected to a second scanning output signal terminal of an $(m-1)^{th}$ shift register, and a second input signal terminal of the $m^{th}$ shift register is electrically connected to a second scanning output signal terminal of an $(m+1)^{th}$ shift register, where $1<m≤M-1$.

For example, a first input signal terminal of a first shift register is electrically connected to a scanning trigger signal terminal, and a second input signal terminal of an M$^{th}$ shift register is electrically connected to an anti-static terminal.

According to a third aspect, the present disclosure provides a display device including the driving circuit provided in the embodiments of the present disclosure.

According to a fourth aspect, the present disclosure provides a driving method applied to the shift register provided in the embodiments of the present disclosure, including, in a first stage, in which the first input signal from the first input signal terminal is at a first level and the second input signal from the second input signal terminal is at a second level, providing the first power supply voltage of the first power supply terminal to the light-emitting control signal terminal and the first node, and providing the second power supply voltage of the second power supply terminal to the second node; in a second stage, in which the first input signal and the second input signal are both at the second level, providing the first power supply voltage to the light-emitting control signal terminal and the first node, and providing the second power supply voltage to the second node; in a third stage, in which the first input signal is at the second level and the second input signal is at the first level, providing the second power supply voltage to the light-emitting control signal terminal and the first node, and providing the first power supply voltage to the second node; and in a fourth stage, in which the first input signal and the second input signal are both at the second level, providing the second power supply voltage to the light-emitting control signal terminal and the first node, and providing the first power supply voltage to the second node.

For example, the driving method further includes: in the first stage, in which the first clock signal from the first clock signal terminal is at the first level, providing the first power supply voltage to the first output scanning signal terminal, and providing the second power supply voltage to the second output scanning signal terminal.

For example, the second stage includes a first sub-stage, a second sub-stage and a third sub-stage. The method further includes: in the first sub-stage, in which the first clock signal from the first clock signal terminal is at the second level, providing the first power supply voltage to the first output scanning signal terminal, and providing the second power supply voltage to the second output scanning signal terminal; in the second sub-stage, in which the first clock signal is at the first level, providing the second power supply voltage to the first output scanning signal terminal, and providing the first power supply voltage to the second output scanning signal terminal; and in the third sub-stage, providing the first power supply voltage to the first output scanning signal terminal, and providing the second power supply voltage to the second output scanning signal terminal.

For example, the driving method further includes: in the third stage, in which the first clock signal from the first clock signal terminal is at the second level, providing the first power supply voltage to the first output scanning signal terminal, and providing the second power supply voltage to the second output scanning signal terminal.

For example, the driving method further includes: in the fourth stage, in which the first clock signal from the first clock signal terminal is at the second level, providing the first power supply voltage to the first output scanning signal terminal, and providing the second power supply voltage to the second output scanning signal terminal.

For example, the driving method further includes: setting a second clock signal from a second clock signal terminal as the second level, in determining that current display data in a display region driven by the shift register is the same as previous display data; and setting the second clock signal as the first level, in determining that the current display data in a designated display region driven by the shift register is different from the previous display data. The display region is a display region in which a pixel row driven by the shift register is located. The current display data is data displayed by the pixel row driven by the shift register in a current working period. The previous display data is multi-frame display data displayed in a plurality of consecutive working periods before the current working period.

For example, the driving method further includes: in the first stage, a third clock signal from a third clock signal terminal is at the first level; in the third stage, the third clock signal is at the first level; and in the fourth stage, the third clock signal is at the second level.

For example, the driving method further includes: in the first sub-stage, a third clock signal from a third clock signal terminal is at the second level; in the second sub-stage, the third clock signal is at the first level; and in the third sub-stage, the third clock signal is at the second level.

DETAILED DESCRIPTION OF EMBODIMENTS

Figure 1A:
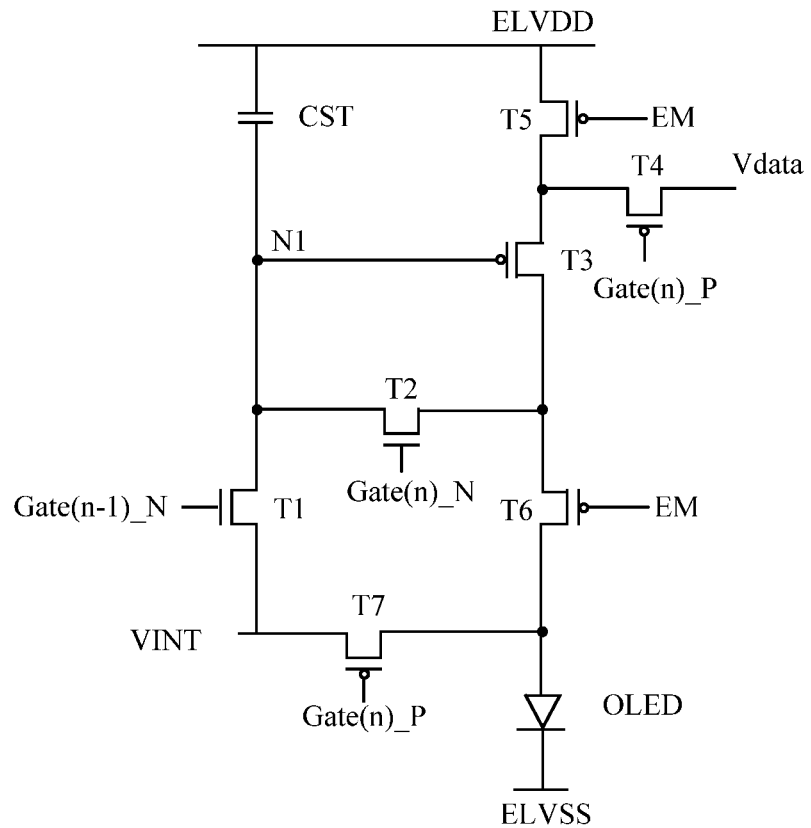
FIG. 1A is a schematic diagram of a structure of a pixel circuit of an example.

In order to make purposes, technical solutions, and advantages of embodiments of the present disclosure clearer, technical solutions in some embodiments of the present disclosure will be described clearly and completely in combination with accompanying drawings. Obviously, the described embodiments are only part of the embodiments of the present disclosure, not all of them. Based on the embodiments of the present disclosure provided, all other embodiments obtained by those of ordinary skilled in the art without creative labor, fall within scope of protection of the present disclosure. It should be noted that throughout the drawings, same elements are represented by same or similar reference signs. In the following description, some specific embodiments are only for descriptive purposes and should not be understood as limiting the present disclosure, but rather as examples of the embodiments of the present disclosure. When it may cause confusion in understanding of the present disclosure, conventional structures or configurations will be omitted. It should be noted that a shape and size of each component in the drawings do not reflect the true size and proportion, but only represent contents of the embodiments of the present disclosure.

Unless otherwise defined, the technical or scientific terms used in the embodiments of the present disclosure shall have the usual meaning understood by those of ordinary skilled in the art. The terms "first", "second", and similar terms used in the embodiments of the present disclosure do not indicate any order, quantity, or importance, but are only used to distinguish different components.

In addition, in description of the embodiments of the present disclosure, the terms "connected" or "electrically connected to" may refer to two components being directly electrically connected to each other, or may refer to two components being connected to each other through one or more other components. In addition, these two components may be connected or coupled in a wired or wireless way.

A source and drain of a switching transistor used in embodiments of the present disclosure are symmetrical, thus the source and drain may be interchangeable. In the embodiments of the present disclosure, according to the functions, the gate may be referred to as a control electrode, one of the source and the drain may be referred to as a first electrode, and the other one of the source and the drain may be referred to as a second electrode.

Furthermore, in the description of the embodiments of the present disclosure, the terms "first power supply voltage" and "second power supply voltage" are only used to distinguish an amplitude difference between the two power supply voltages. For example, in the following text, the "first power supply voltage" is described as a relatively high voltage, and the "second power supply voltage" is described as a relatively low voltage. Those of skill in the art may understand that the present disclosure is not limited to this.

It should be noted that in the explanation of the embodiments of the present disclosure, a symbol Vdata may represent both a data signal and a level of the data signal. Similarly, a symbol Gate may represent both a gate driving signal and a level of the gate driving signal, a symbol VINT may represent both a predetermined initial voltage terminal and a voltage of an initial signal, a symbol ELVDD may represent both a power supply and a voltage provided by the power supply, and INPUT may represent both an input signal terminal and an input signal provided by the input signal terminal, OUTPUT may represent both an output signal terminal and an output signal provided by the output signal terminal, and VGH and VGL may represent both a power supply terminal and a voltage provided by the power supply terminal. The following embodiments are the same as these, which will not be repeated here.

A pixel unit of a pixel circuit of an LED display panel and OLED display panel may be in a 7T1C structure, that is, each pixel unit includes 7 thin film transistors (TFTs) and 1 capacitor (C), as shown in FIG. 1.

Figure 1B:
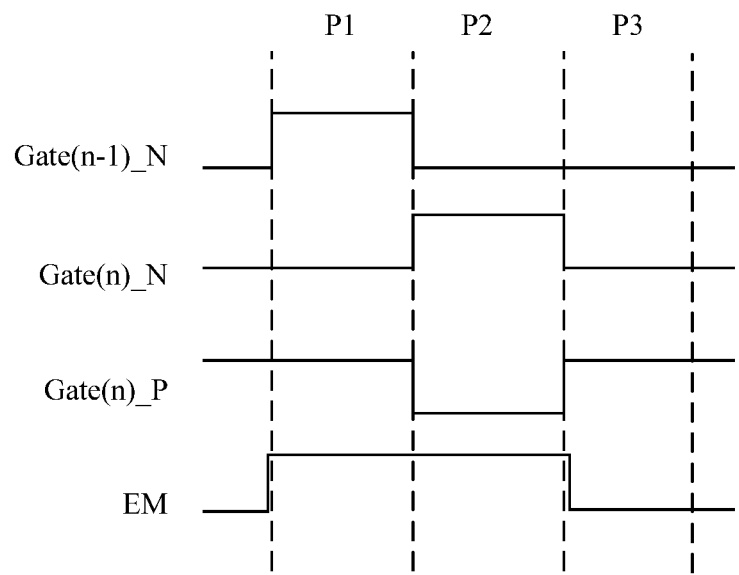
FIG. 1B is a signal timing diagram of the pixel circuit in FIG. 1A.

FIG. 1A is a schematic diagram of a structure of a pixel circuit of an example. FIG. 1B is a signal timing diagram of the pixel circuit in FIG. 1A.

In an example of FIG. 1A, transistors T1 and T2 may be N-type transistors, and transistors T3 to T7 may be P-type transistors.

In an example of FIG. 1B, in an initialization stage P1, a level of a gate driving signal Gate(n−1)_N is at a high level. In a data writing stage P2, a level of a gate driving signal Gate(n)_N is at a high level, and a level of a gate driving signal Gate(n)_P is at a low level. In a light-emitting stage P3, a level of a light-emitting control signal EM is at a low level.

In the initialization phase P1, under a high-level control of the gate driving signal Gate(n−1)_N, the transistor T1 is turned on. A gate of a driving transistor T3 is initialized by an initialization signal VINT, thereby initializing a gate voltage of the driving transistor T3 to VINT while charging a storage capacitor CST. At this time, a voltage at a point N1 is VINT.

In the data writing stage P2, under a low-level control of the gate driving signal Gate(n)_P, a transistor T7 is turned on. The initialization signal VINT is written to an anode of a light-emitting element OLED along an initialization path from a predetermined initial voltage terminal to the light-emitting element OLED, thereby initializing an anode voltage of the light-emitting element OLED to VINT. It is possible to release residual charges of the anode of the light-emitting element OLED, thereby eliminating a residual voltage of the anode of the light-emitting element OLED.

At this time, under the high-level control of the gate driving signal Gate(n)_N, the transistor T2 is turned on, and under the low-level control of the gate driving signal Gate(n)_P, the transistor T4 is turned on. The driving transistor T3 is turned on under a driving of a voltage signal stored in the storage capacitor CST. The data signal Vdata is written to the node N1 along a path from a data signal terminal to the transistors T4, T3 and T2. At this time, the data signal Vdata may charge the storage capacitor CST and the driving transistor T3 gradually turns off. When Vgs=Vg−Vs=Vg−Vdata≥Vth is satisfied, the driving transistor T3 is turned off, and the charging of the storage capacitor CST is completed. At this time, a potential Vg of the node N1 is Vg=Vth+Vdata.

It may be understood that Vth is a threshold voltage of the driving transistor T3, Vgs is a gate-source voltage of the driving transistor T3, Vg is a gate voltage of the driving transistor T3, and Vs is a source voltage of the driving transistor T3. A voltage difference (VINT−ELVSS) between the initial signal terminal VINT and a second power supply terminal ELVSS should be less than the threshold voltage Vth of the light-emitting element OLED, thus it is possible to ensure that the light-emitting element OLED will not emit light in the data writing stage.

In the light-emitting stage P3, under a low-level control of the light-emitting control signal EM, the transistors T5 and T6 are turned on. At this time, a source potential Vs of the driving transistor is Vs=Vdd, a gate potential Vg=Vth+Vdata, Vgs=Vth+Vdata−Vdd<Vth, the driving transistor T3 is turned on under a driving of the voltage signal stored in the storage capacitor CST. The transistor T5 and the transistor T6 are turned on, and a voltage of the first power supply terminal ELVDD is written into the circuit. A driving current is applied to the light-emitting element OLED along a light-emitting path from the power supply to the light-emitting element OLED via the transistor T5, the driving transistor T3 and the transistor T6, so that the light-emitting element OLED emits light. At this time, the current flowing through the pixel is Id=A(Vdd−Vdata)$^2$, where A is a constant.

The display may include a pixel array and a GOA circuit. The pixel array includes a plurality of pixel circuits arranged in an array form, and each pixel circuit may be shown in FIG. 1A, and the pixel array is used to display an image. The GOA circuit is used to provide a driving signal for the pixel array. For example, the GOA circuit may include a plurality of GOA units which are cascaded, and each GOA unit provides a driving signal to a row of pixel units in the pixel array. For example, the gate driving signal Gate(n)_N and the gate driving signal Gate(n)_P may be gate driving signals provided by a GOA unit corresponding to a row of pixel units, and the gate driving signal Gate(n−1)_N be a gate driving signal provided by a previous GOA unit.

The light-emitting control signal EM may also be provided by an Emission On Array (EOA) circuit. The EOA circuit includes a plurality of EOA units which are cascaded, and each EOA unit provides a light-emitting control signal EM to a row of pixel units in the pixel array.

Therefore, the pixel circuit formed by the pixel units shown in FIG. 1 requires three groups of driving circuits to provide driving signals. For example, two groups of GOA circuits respectively provide gate driving signal Gate(n)_N and gate driving signal Gate(n)_P. A group of EOA circuits provide light-emitting control signal EM. In the display, three groups of driving circuits may occupy a large amount of space, so that it is difficult to narrow the borders of the display.

For the above problems, the present disclosure provides a shift register. A shift register serves as a GOA unit. A gate driving signal Gate(n)_N, a gate driving signal Gate(n)_P and a light-emitting control signal EM may be provided for a corresponding row of pixel units through a GOA unit. A group of GOA circuits may be obtained by cascading a plurality of shift registers provided in the present disclosure. The gate driving signal Gate(n)_N, the gate driving signal Gate(n)_P and the light-emitting control signal EM may be provided for the pixel array in the display.

Figure 2A:
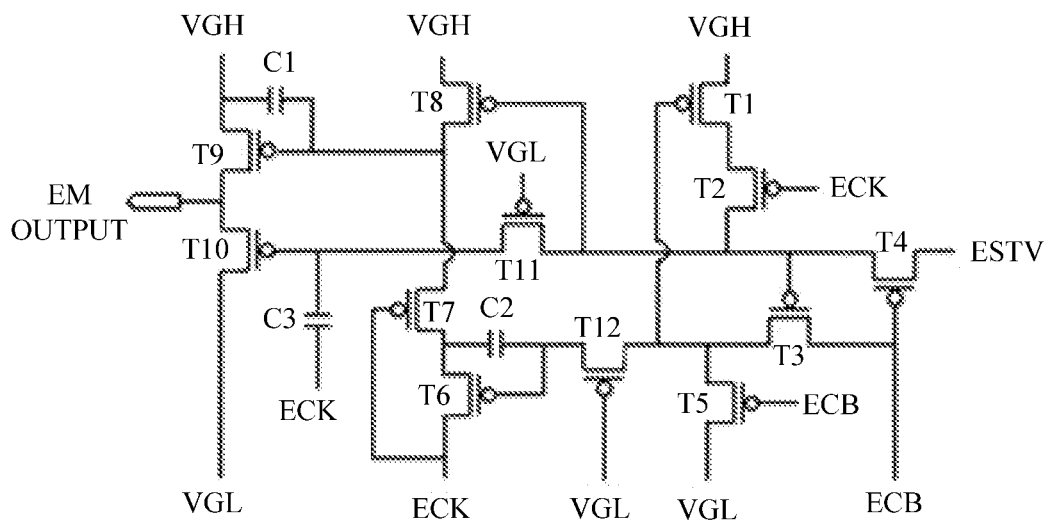
FIG. 2A is a schematic diagram of a structure of a driving circuit of an example.
Figure 2B:
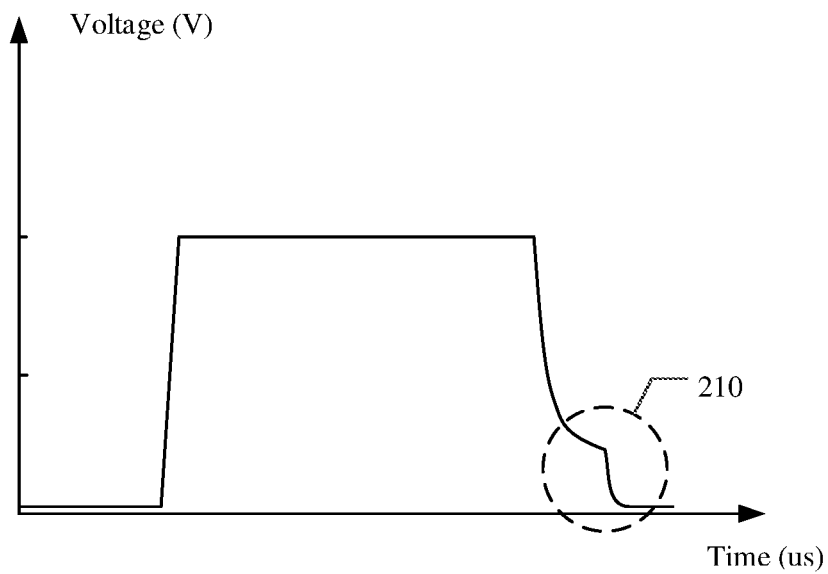
FIG. 2B is a schematic diagram of a light-emitting control signal output by the driving circuit in FIG. 2A.

FIG. 2A is a schematic diagram of a structure of a driving circuit of an example. FIG. 2B is a schematic diagram of light-emitting control signal output by the driving circuit in FIG. 2A.

FIG. 2A shows an EOA unit 200a of an EOA circuit. Each EOA unit 200a may include 12 transistors and 3 capacitors, as shown in FIG. 2A.

In the example of FIG. 2A, transistors T1 to T12 may be P-type transistors, an output terminal EMOUTPUT outputs a light-emitting control signal EM, an input terminal ESTV provides a trigger signal, and clock signal terminals ECK and ECB provide clock signals. A power supply terminal VGH may provide a high level power supply voltage VGH, a power supply terminal VGL may provide a low level power supply voltage VGL, and the power supply voltage VGH is greater than the power supply voltage VGL terminal.

In the EOA unit 200a, the light-emitting control signal EM output by the output terminal EMOUTPUT is controlled by the transistor T9 and the transistor T10. When the transistor T9 is turned on and the transistor T10 is turned off, the light-emitting control signal EM output from the output terminal EMOUTPUT is at a high level. When the transistor T9 is turned off and the transistor T10 is turned on, the light-emitting control signal EM output by the output terminal EMOUTPUT is at a low level.

A gate of the transistor T9 is affected by a capacitance stored in capacitor C1, while a gate of transistor T10 is affected by a capacitance stored in capacitor C3. Due to the instability of the stored capacitance, the potential of the output light-emitting control signal EM will be floating, as shown in FIG. 2B.

FIG. 2B shows a potential change process of the light-emitting control signal EM output by the EOA unit 200a in FIG. 2A. In the potential change 200b of the light-emitting control signal EM, during the process of decreasing from a high level to a low level, the potential of the light-emitting control signal EM in a region 210 shows a secondary pull-down phenomenon, which may cause the light-emitting control signal EM to be floating and be easily affected by external interference. Therefore, the design of the capacitor in the EOA unit shown in FIG. 2A will affect the stability of the light-emitting control signal EM.

For the above problems, the present disclosure provides a shift register, which serves as an EOA unit. The shift register includes a plurality of transistors and does not require a capacitor structure. A processing circuit is provided in the shift register to maintain the stable output of the light-emitting control signal EM, so that the output light-emitting control signal EM has no floating phenomenon.

Figure 3:
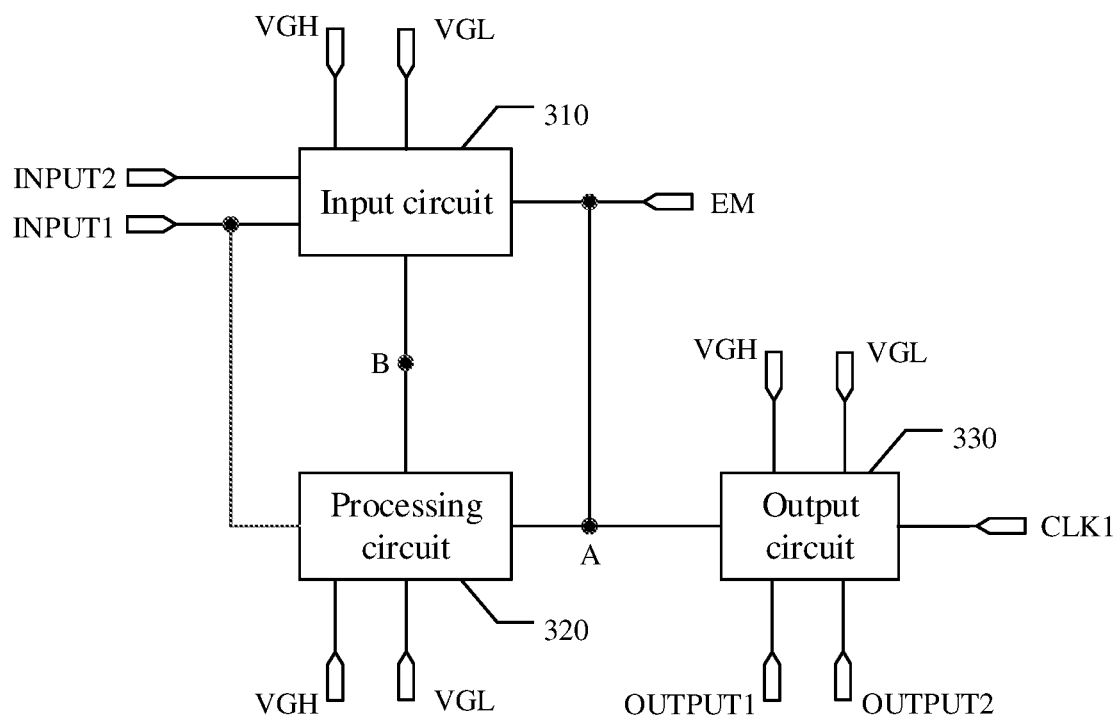
FIG. 3 is a schematic diagram of a structure of a shift register according to an embodiment of the present disclosure.

FIG. 3 is a schematic diagram of a structure of a shift register according to an embodiment of the present disclosure.

As shown in FIG. 3, a shift register 300 includes an input circuit 310, a processing circuit 320 and an output circuit 330.

In an embodiment of the present disclosure, the input circuit 310 is electrically connected to a first input signal terminal INPUT1, a second input signal terminal INPUT2, a first power supply terminal VGH, a second power supply terminal VGL, and a light-emitting control signal terminal EM. The input circuit 310 may output a light-emitting control signal EM.

The input circuit 310 is configured to provide a first power supply voltage of the first power supply terminal VGH or a second power supply voltage of the second power supply terminal VGL to a first node A under a control of a first input signal from the first input signal terminal INPUT1 and the second input signal from the second input signal terminal INPUT1. The light-emitting control signal terminal EM is electrically connected to the first node A.

The processing circuit 320 is electrically connected to the first input signal terminal INPUT1, the first node A1, the first power supply terminal VGH, and the second power supply terminal VGL. The processing circuit 320 may maintain a stable light-emitting control signal EM output from the input circuit 310.

The processing circuit 320 is configured to provide a first power supply voltage VGH or a second power supply voltage VGL to a second node B under a control of a potential of the first node A and the first input signal INPUT1. The input circuit 310 is electrically connected to the second node B. Under a control of a potential of the second node B, the input circuit 310 provides the first power supply voltage VGH or the second power supply voltage VGL to the light-emitting control signal terminal EM.

For example, when the first power supply voltage VGH is provided to the first node A, the processing circuit 320 may provide the second power supply voltage VGL to the second node B under the control of the potential of the first node A and the first input signal INPUT1. Under the control of the potential of the second node B, the input circuit 310 provides the first power supply voltage VGH to the light-emitting control signal terminal EM.

For example, when the second power supply voltage VGL is provided to the first node A, the processing circuit 320 may provide the first power supply voltage VGH to the second node B under the control of the potential of the first node A and the first input signal INPUT1. Under the control of the potential of the second node B, the input circuit 310 provides the second power supply voltage VGL to the light-emitting control signal terminal EM.

This allows a stable feedback closed loop between the input circuit 310 and the processing circuit 320 to be formed, thereby maintaining the input circuit 310 to output a stable light-emitting control signal EM.

The output circuit 330 is electrically connected to a first clock signal terminal CLK1, the first node A, the first power supply terminal VGH, the second power supply terminal VGL, a first output scanning signal terminal OUTPUT1, and a second output scanning signal terminal PUTPUT2. The output circuit 330 may output scanning signals, which may be used as gate driving signals. For example, the first output scanning signal terminal OUTPUT1 outputs a gate driving signal Gate(n)_P. The second output scanning signal terminal PUTPUT2 outputs a gate driving signal Gate(n)_N.

The output circuit 330 is configured to provide the first power supply voltage VGH or the second power supply voltage VGL to the first output scanning signal terminal OUTPUT1 under the control of the potential of the first node A and a first clock signal from the first clock signal terminal CLK, and to provide the first power supply voltage VGH or the second power supply voltage VGL to the second output scanning signal terminal OUTPUT2 under the control of a potential of the first output scanning signal terminal OUTPUT1.

In an embodiment of the present disclosure, the shift register 300 may be a driving unit in the driving circuit. A driving unit may output a gate driving signal Gate(n)_N, a gate driving signal Gate(n)_P and a light-emitting control signal EM. For example, the driving unit may include an EOA unit and a GOA unit. The input circuit 310 and the processing circuit 320 may achieve a function of outputting a light-emitting control signal EM from the EOA unit, and the output circuit 330 may achieve a function of outputting a gate driving signal Gate(n) from the GOA unit.

In an embodiment of the present disclosure, the first input signal terminal INPUT1 may be a gate driving signal Gate(n−1)_N output by a previous GOA unit in the driving circuit. The second input signal terminal INPUT2 may be a gate driving signal Gate(n+1)_N output by a next GOA unit in the driving circuit.

In an embodiment of the present disclosure, the input circuit 310, the processing circuit 320 and the output circuit 330 are electrically connected to the first node A. The gate driving signal Gate(n−1)_N from the previous GOA unit and the gate driving signal Gate(n+1)_N of the second input signal terminal INPUT2 from the next GOA unit may be input signals of the EOA unit, and the light-emitting control signal EM is an output signal of the EOA unit. The potential of the light-emitting control signal terminal EM is consistent with the level of the first node A. The light-emitting control signal EM output by the EOA unit may be used as an input signal of the output circuit 330, and the gate driving signal Gate(n)_N and the gate driving signal Gate(n)_P are output signals of the GOA unit.

Through the shift register 300 provided in the present disclosure, by taking one shift register 300 as a driving unit, the gate driving signal Gate(n)_N, the gate driving signal Gate(n)_P and the light-emitting control signal EM may be provided to a corresponding row of pixel units in a pixel array through one driving unit, thereby reducing the space occupied by the driving circuit, which is beneficial for narrowing a frame of the display. In addition, by using the processing circuit 320 in the shift register 300, the stable output of the light-emitting control signal EM is maintained, so that the output light-emitting control signal EM has no floating phenomenon.

It should be noted that the first node A and the second node B do not represent actual components, but rather represent convergence points of the relevant circuit connections in the circuit diagram.

Figure 4:
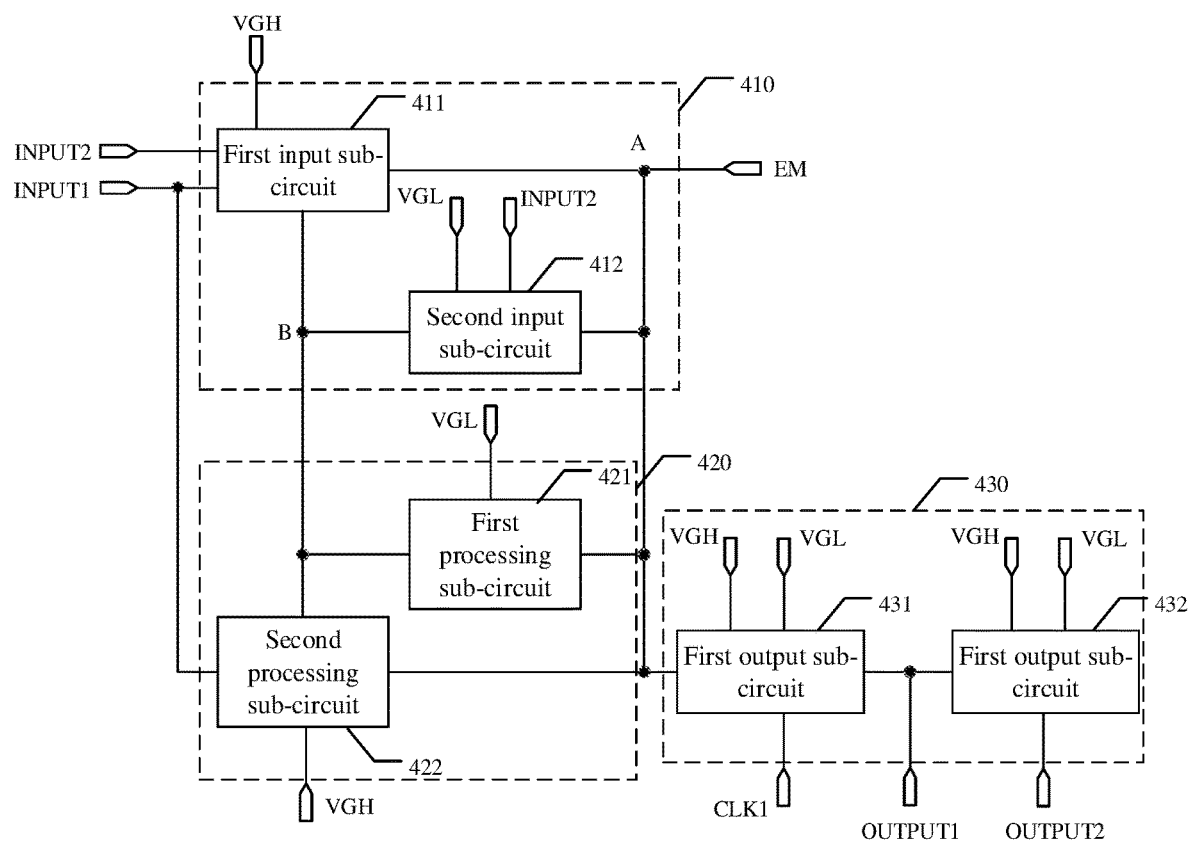
FIG. 4 is a schematic diagram of a structure of a shift register according to another embodiment of the present disclosure.

FIG. 4 is a schematic diagram of a structure of a shift register according to another embodiment of the present disclosure.

As shown in FIG. 4, the shift register 400 includes an input circuit 410, a processing circuit 420 and an output circuit 430. The input circuit 410, the processing circuit 420 and the output circuit 430 are similar to the input circuit 310, the processing circuit 320 and the output circuit 330 mentioned in the previous description, respectively. For simplicity, the same parts will not be repeated herein.

In an embodiment of the present disclosure, the input circuit 410 includes a first input sub-circuit 411 and a second input sub-circuit 412.

In an embodiment of the present disclosure, a first terminal of the first input sub-circuit 411 and a first terminal of the second input sub-circuit 412 are electrically connected to the first node A, and the first node A is electrically connected to the light-emitting control terminal EM. A second terminal of the first input sub-circuit 411 and a second terminal of the second input sub-circuit 412 are electrically connected to the second node B.

The first input sub-circuit 411 is electrically connected to the first input signal terminal INPUT1, the second input signal terminal INPUT1, the first power supply terminal VGH and the light-emitting control signal terminal EM. The first input sub-circuit 4 is configured to provide the first power supply voltage VGH to the light-emitting control signal terminal under a control of the first input signal and the second input signal.

The second input sub-circuit 412 is electrically connected to the second input signal terminal INPUT1, the second power supply terminal VGL, and the light-emitting control signal terminal EM. The second input sub-circuit 412 is configured to provide the second power supply voltage VGL to the light-emitting control signal terminal EM under a control of the second input signal.

For example, the first input sub-circuit 411 may output a light-emitting control signal EM with a high potential, and the second input sub-circuit 412 may output a light-emitting control signal EM with a low potential.

In an embodiment of the present disclosure, the processing circuit 420 includes a first processing sub-circuit 421 and a second processing sub-circuit 422.

In an embodiment of the present disclosure, a first terminal of the first processing sub-circuit 421 and a first terminal of the second processing sub-circuit 422 are electrically connected to the first node A, and the first node A is electrically connected to the light-emitting control terminal EM. A second terminal of the first processing sub-circuit 421 and a second terminal of the second processing sub-circuit 422 are electrically connected to the second node B.

The first processing sub-circuit 421 is electrically connected to the first node A, the second node B and the second power supply terminal VGL. Under the control of the potential of the first node A, the first processing sub-circuit 421 provides the second power supply voltage VGL to the second node B.

The second processing sub-circuit 422 is electrically connected to the first input signal terminal INPUT, the first node A, the second node B, and the first power supply terminal VGH. Under the control of the potential of the first node A and the first input signal, the second processing sub-circuit 422 provides the first power supply voltage VGH to the second node B.

In an embodiment of the present disclosure, the first terminal of the first input sub-circuit 411 and the first terminal of the first processing sub-circuit 421 are electrically connected to the first node A, and the second terminal of the first input sub-circuit 411 and the second terminal of the first processing sub-circuit 421 are electrically connected to the second node B.

When the first input sub-circuit 411 outputs a light-emitting control signal EM with a high potential, under the control of the potential of the first node A, the first processing sub-circuit 421 provides the second power supply voltage VGL to the second node B. At this time, under the control of the potential of the second node B, the first input sub-circuit 411 provides the first power supply voltage VGH to the light-emitting control signal terminal EM. This allows a stable feedback between the first input sub-circuit 411 and the first processing sub-circuit 421 to be formed, so that the first input sub-circuit 411 may output a stable light-emitting control signal EM.

In an embodiment of the present disclosure, the first terminal of the second input sub-circuit 412 and the first terminal of the second processing sub-circuit 422 are electrically connected to the first node A, and the second terminal of the second input sub-circuit 412 and the second terminal of the second processing sub-circuit 422 are electrically connected to the second node B.

When the second input sub-circuit 412 outputs a light-emitting control signal EM with a low potential, under the control of the potential of the first node A, the second processing sub-circuit 422 provides the first power supply voltage VGH to the second node B. At this time, under the control of the potential of the second node B, the second input sub-circuit 412 provides the second power supply voltage VGL to the light-emitting control signal terminal EM. This allows a stable feedback between the second input sub-circuit 412 and the second processing sub-circuit 422 to be formed, so that the second input sub-circuit 412 may output a stable light-emitting control signal EM.

In an embodiment of the present disclosure, the output circuit 430 includes a first output sub-circuit 431 and a second output sub-circuit 432.

In an embodiment of the present disclosure, a first terminal of the first output sub-circuit 431 is electrically connected to the first node A, and a second terminal of the first output sub-circuit 431 and a first terminal of the second output sub-circuit 432 are electrically connected to the first output scanning signal terminal OUTPUT1. A second terminal of the second output sub-circuit 432 is electrically connected to the second output scanning signal terminal OUTPUT2.

The first output sub-circuit 431 is electrically connected to a first clock signal terminal CLK1, the first node A, the first power supply terminal VGH, the second power supply terminal VGL, and a first output scanning signal terminal OUTPUT1. Under the control of the potential of the first node A and the first clock signal CLK1, the first output sub-circuit 431 provides the first power supply voltage VGH or the second power supply voltage VGL to the first output scanning signal terminal.

The second output sub-circuit 432 is electrically connected to the first output scanning signal terminal OUTPUT1, the first power supply terminal VGH, the second power supply terminal VGL and the second output scanning signal terminal OUTPUT2. Under the control of the potential of the first output scanning signal terminal, the second output sub-circuit 432 provides the first power supply voltage VGH or the second power supply voltage VGL to the second output scanning signal terminal.

For example, when the first output sub-circuit 431 outputs a gate driving signal Gate(n)_P with a high potential, the second output sub-circuit 432 outputs a gate driving signal Gate(n)_N with a low potential. When the first output sub-circuit 431 outputs a gate driving signal Gate(n)_P with a low potential, the second output sub-circuit 432 outputs a gate driving signal Gate(n)_N with a high potential.

Figure 5A:
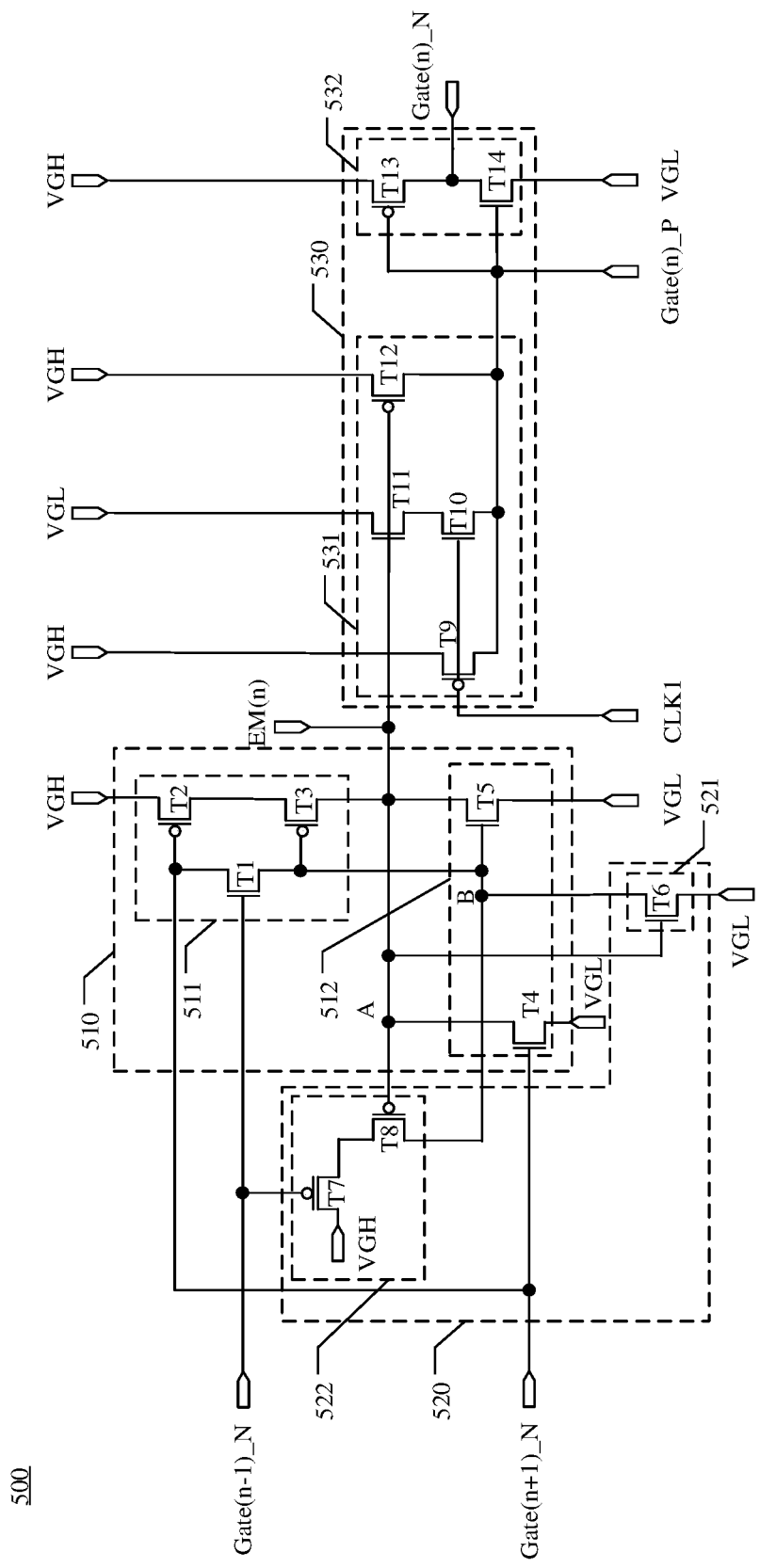
FIG. 5A is a schematic diagram of a structure of a shift register according to another embodiment of the present disclosure.

FIG. 5A is a schematic diagram of a structure of a shift register according to another embodiment of the present disclosure.

As shown in FIG. 5A, the shift register 500 includes an input circuit 510, a processing circuit 520 and an output circuit 530. The input circuit 510 includes a first input sub-circuit 511 and a second input sub-circuit 512. The processing circuit 520 includes a first processing sub-circuit 521 and a second processing sub-circuit 522. The output circuit 530 includes a first output sub-circuit 531 and a second output sub-circuit 532.

The input circuit 510, the processing circuit 520 and the output circuit 530 are similar to the input circuit 310, the processing circuit 320 and the output circuit 330 mentioned in the previous description, respectively. The first input sub-circuit 511 and the second input sub-circuit 512 are similar to the first input sub-circuit 411 and the second input sub-circuit 412 mentioned in the previous description, respectively. The first processing sub-circuit 521 and the second processing sub-circuit 522 are similar to the first processing sub-circuit 421 and the second processing sub-circuit 422 mentioned in the previous description, respectively, The first output sub-circuit 531 and the second output sub-circuit 532 are similar to the first output sub-circuit 431 and the second output sub-circuit 432 mentioned in the previous description, respectively. For simplicity, the same parts will not be repeated herein.

In an embodiment of the present disclosure, the first input sub-circuit 511 includes a first transistor T1, a second transistor T2 and a third transistor T3. The first transistor T1, the second transistor T2 and the third transistor T3 are used as switching transistors. The first transistor T1 is an N-type transistor, while the second transistor T2 and the third transistor T3 are P-type transistors.

A gate of the first transistor T1 is electrically connected to the first input signal terminal Gate(n−1)_N, a first electrode of the first transistor T1 is electrically connected to the second input signal terminal Gate(n+1)_N, and a second electrode of the first transistor T1 is electrically connected to a gate of the third transistor T3. A gate of the second transistor T2 is electrically connected to the second input signal terminal Gate(n+1)_N, a first electrode of the second transistor T2 is electrically connected to the first power supply terminal VGH, and a second electrode of the second transistor T2 is electrically connected to a first electrode of the third transistor T3. A gate of the third transistor T3 and a second electrode of the first transistor T1 are electrically connected to the second node B, and a second electrode of the third transistor T3 and the light-emitting control signal terminal EM(n) are electrically connected to the first node A.

The second input sub-circuit 512 includes a fourth transistor T4 and a fifth transistor T5. The fourth transistor T4 and the fifth transistor T5 are used as switching transistors. The fourth transistor T4 and the fifth transistor T5 are N-type transistors.

A gate of the fourth transistor T4 is electrically connected to the second input signal terminal Gate(n+1)_N, a first electrode of the fourth transistor T4 is electrically connected to the second power supply terminal VGL, and a second electrode of the fourth transistor T4 and the light-emitting control signal terminal EM(n) are electrically connected to the first node A. A gate of the fifth transistor T5 and the gate of the third transistor T3 in the first input sub-circuit 410 are electrically connected to the second node B, a first electrode of the fifth transistor T5 is electrically connected to the second power supply terminal VGL, and a second electrode of the fifth transistor T5 and the light-emitting control signal terminal EM(n) are electrically connected to the first node A.

In an embodiment of the present disclosure, the first processing sub-circuit 521 includes a sixth transistor T6. The sixth transistor T6 is used as a switching transistor, and the sixth transistor T6 is an N-type transistor.

A gate of the sixth transistor T6 is electrically connected to the first node A, a first electrode of the sixth transistor T6 is electrically connected to the second power supply terminal VGL, and a second electrode of the sixth transistor T6 is electrically connected to the second node B.

In an embodiment of the present disclosure, the second processing sub-circuit 522 includes a seventh transistor T7 and an eighth transistor T8. The seventh transistor T7 and the eighth transistor T8 are used as switching transistors, and the seventh transistor T7 and eighth transistor T8 are P-type transistors.

A gate of the seventh transistor T7 is electrically connected to the first input signal terminal Gate(n−1)_N, a first electrode of the seventh transistor T7 is electrically connected to the first power supply terminal VGH, and a second electrode of the seventh transistor T7 is electrically connected to a first electrode of the eighth transistor T8. A gate of the eighth transistor T8 is electrically connected to the first node A, and a second electrode of the eighth transistor T8 and the second electrode of the sixth transistor T6 in the first processing sub-circuit 521 are electrically connected to the second node B.

In an embodiment of the present disclosure, the first output sub-circuit 531 includes a ninth transistor T9, a tenth transistor T10, an eleventh transistor T11, and a twelfth transistor T12. The ninth transistor T9, the tenth transistor T10, the eleventh transistor T11 and the twelfth transistor T12 are used as switching transistors. The ninth transistor T9 and the twelfth transistor T12 are P-type transistors. The tenth transistor T10 and the eleventh transistor T11 are N-type transistors.

A gate of the ninth transistor T9 is electrically connected to the first clock signal terminal CLK1, a first electrode of the ninth transistor T9 is electrically connected to the first power supply terminal VGH, and a second electrode of the ninth transistor T9 is electrically connected to the first output scanning signal terminal Gate(n)_P. A gate of the tenth transistor T10 is electrically connected to the first clock signal terminal CLK1, a first electrode of the tenth transistor T10 is electrically connected to a second electrode of the eleventh transistor T11, and a second electrode of the tenth transistor T10 is electrically connected to the first output scanning signal terminal Gate(n)_P. A gate of the eleventh transistor T11 is electrically connected to the first node A, and a first electrode of the eleventh transistor T11 is electrically connected to the second power supply terminal VGL. A gate of the twelfth transistor T12 is electrically connected to the first node A, a first electrode of the twelfth transistor T12 is electrically connected to the first power supply terminal VGH, and a second electrode of the twelfth transistor T12 is electrically connected to the first output scanning signal terminal Gate(n)_P.

The second output sub-circuit 532 includes a thirteenth transistor T13 and a fourteenth transistor T14. The thirteenth transistor T13 and the fourteenth transistor T14 are used as switching transistors. The thirteenth transistor T13 is a P-type transistor, and the fourteenth transistor T14 is an N-type transistor.

A gate of the thirteenth transistor T13 is electrically connected to the first output scanning signal terminal Gate(n)_P, a first electrode of the thirteenth transistor T13 is electrically connected to the first power supply terminal VGH, and a second electrode of the thirteenth transistor T13 is electrically connected to the second output scanning signal terminal Gate(n)_N. A gate of the fourteenth transistor T14 is electrically connected to the first output scanning signal terminal Gate(n)_P, a first electrode of the fourteenth transistor T14 is electrically connected to the second power supply terminal VGL, and a second electrode of the fourteenth transistor T14 is electrically connected to the second output scanning signal terminal Gate(n)_N.

Figure 5B:
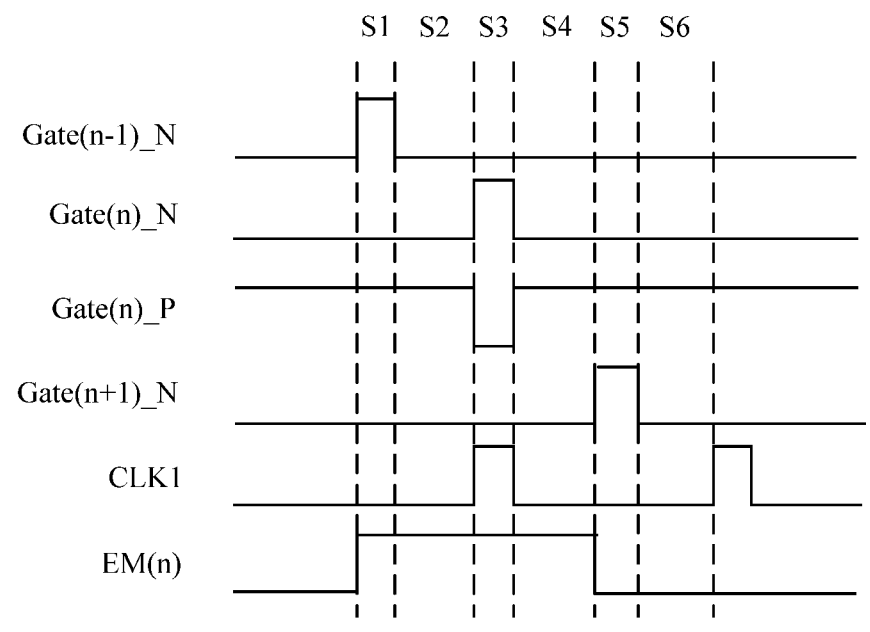
FIG. 5B is a signal timing diagram of the shift register in FIG. 5A.

FIG. 5B is a signal timing diagram of the shift register in FIG. 5A. FIG. 5B shows timing waveforms of each signal in each stage. Taking the structure of the shift register shown in FIG. 5A as an example, with reference to the signal timing diagram shown in FIG. 5B, a working process of the shift register provided in the embodiment of the present disclosure will be described. The working process of the shift register includes 6 stages.

Figure 6A:
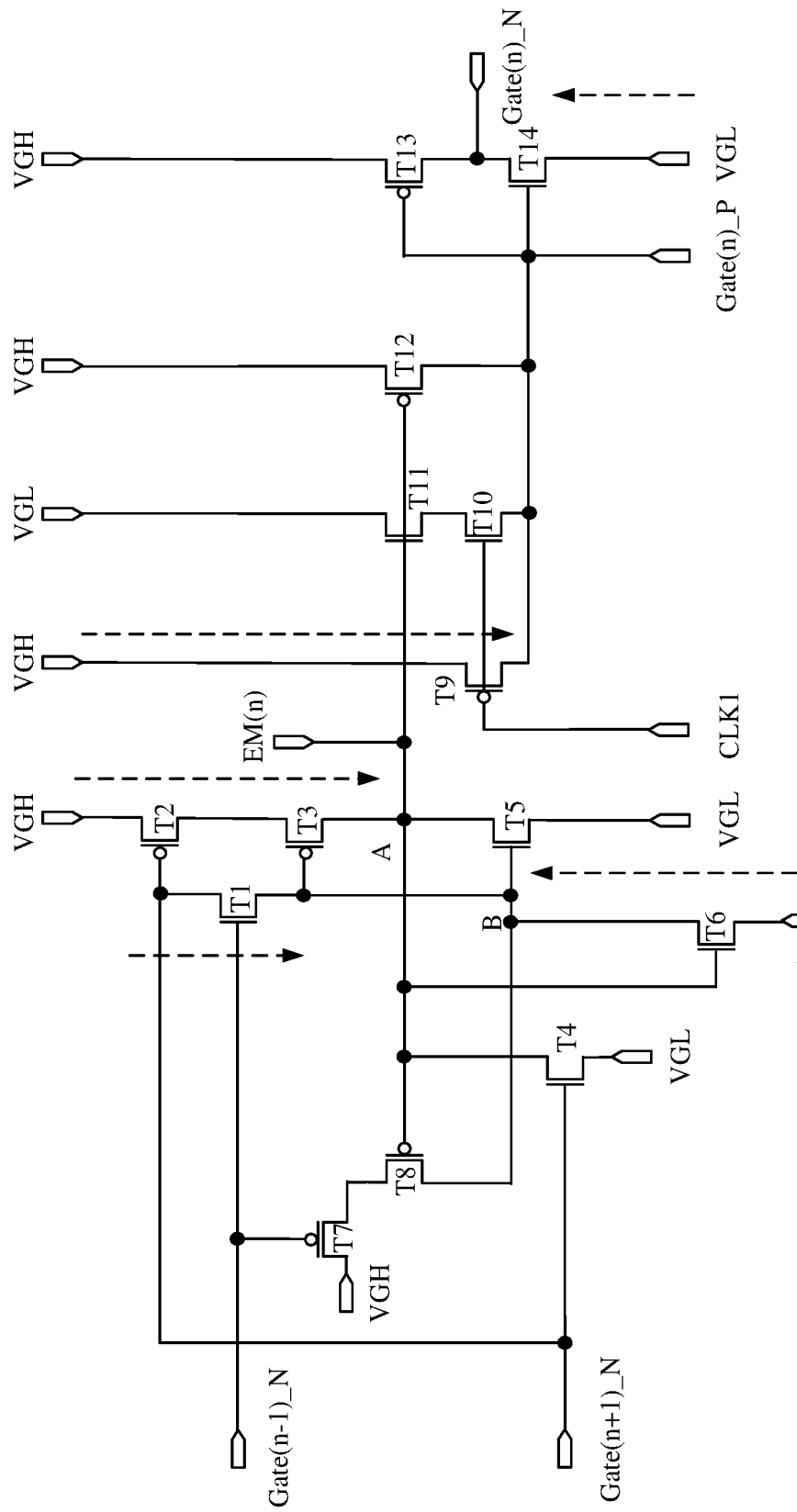
FIG. 6A to FIG. 6F are equivalent circuit diagrams of a shift register at different stages according to an embodiment of the present disclosure.
Figure 6B:
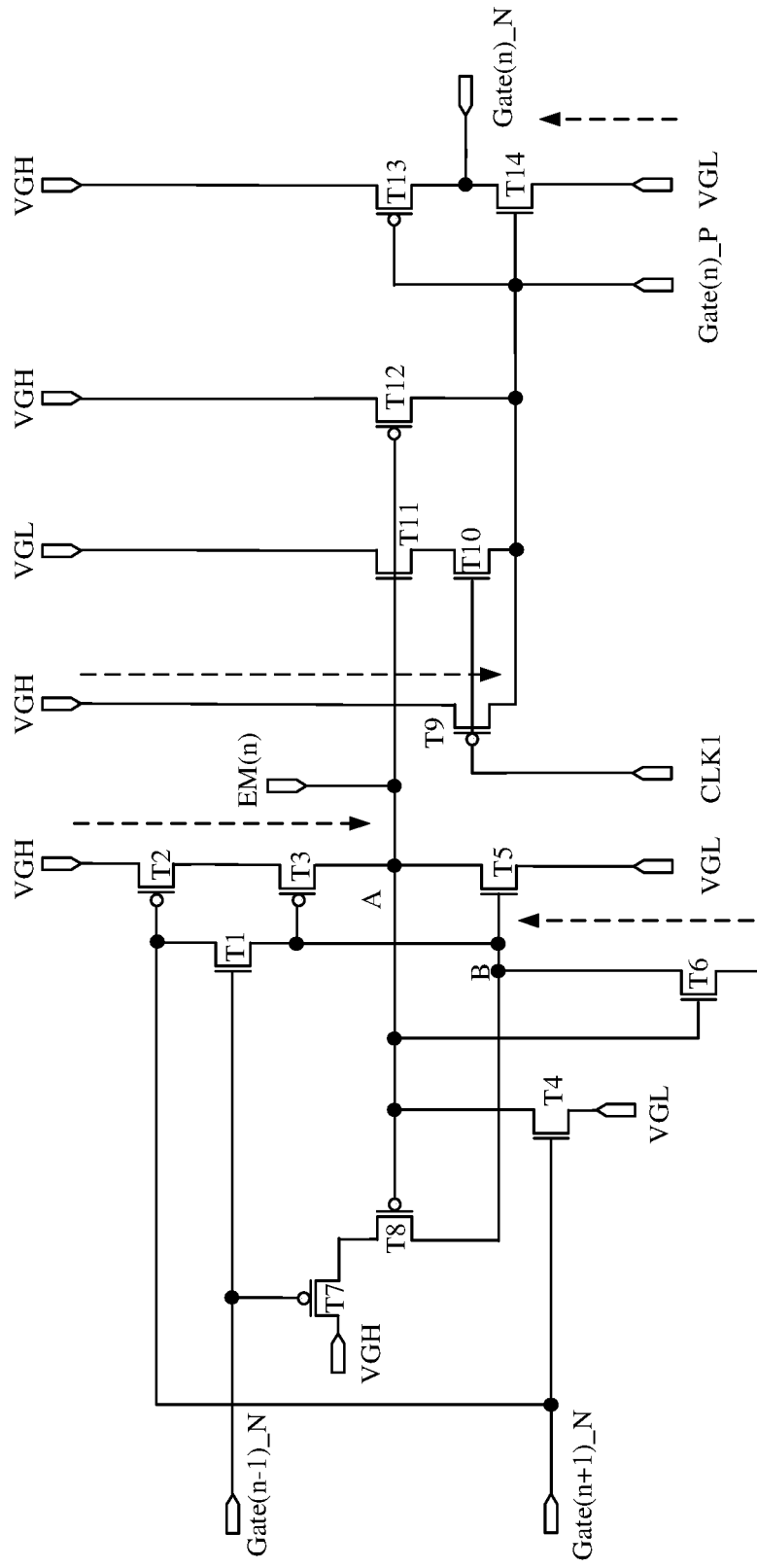
Figure 6C:
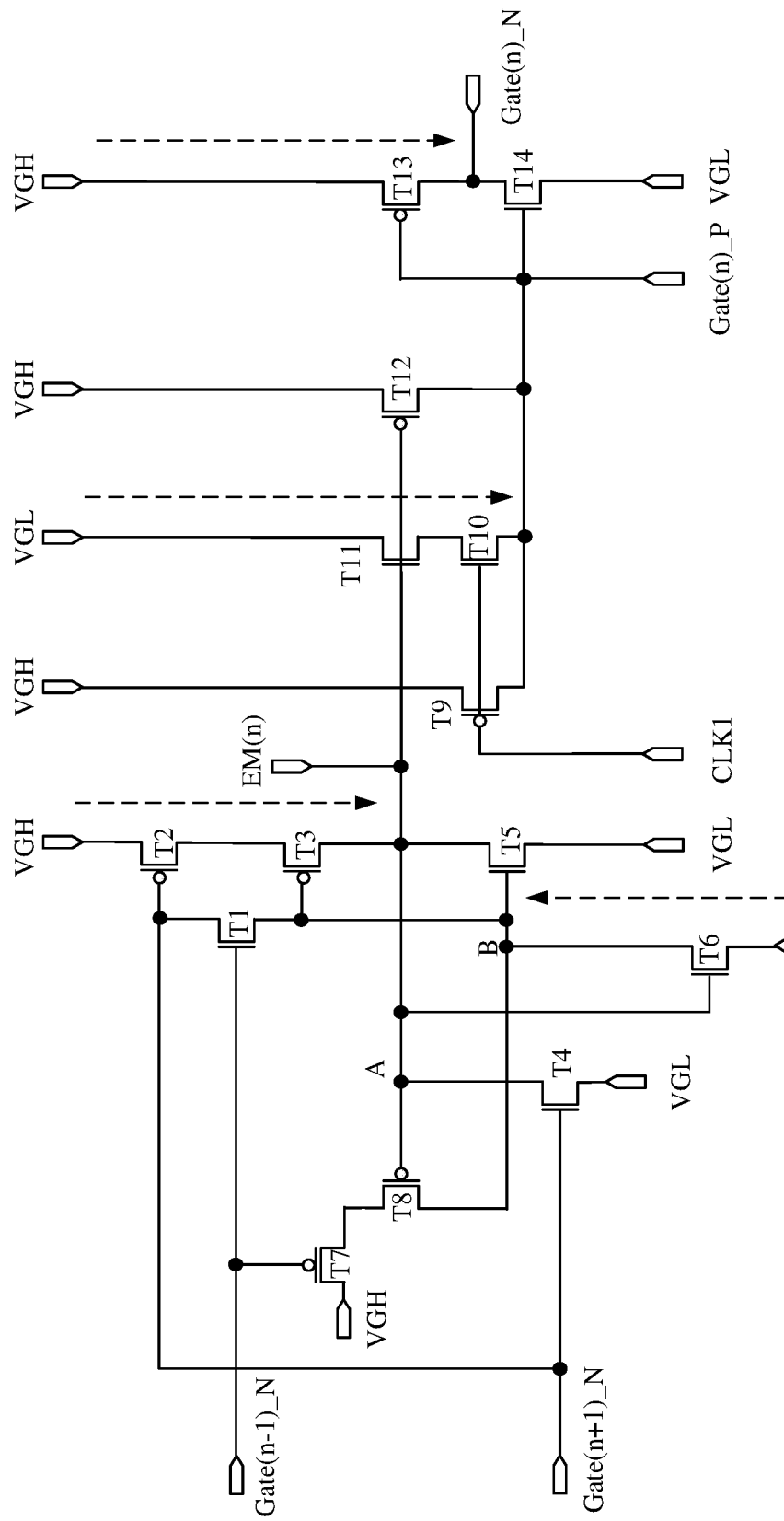
Figure 6D:
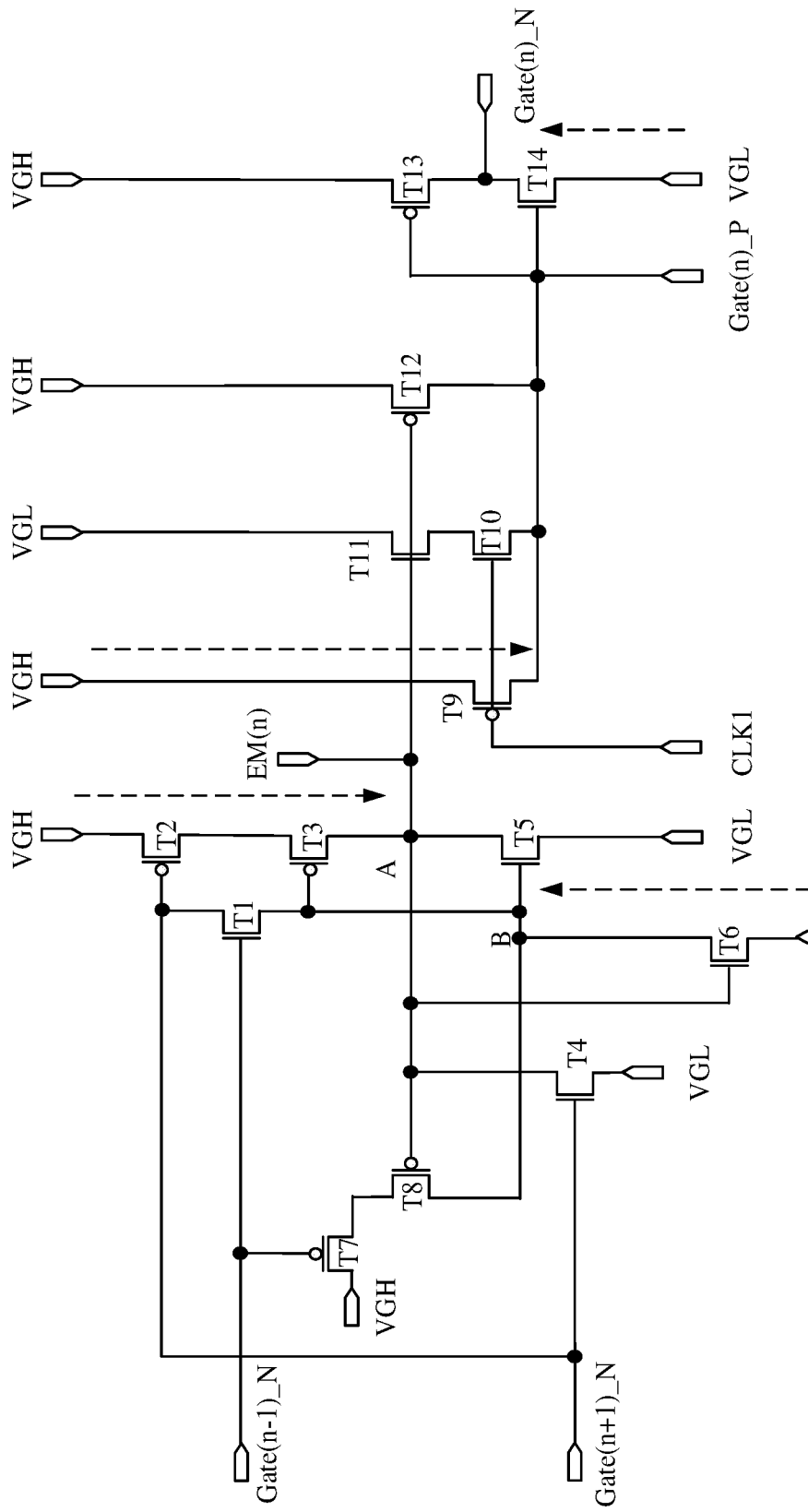
Figure 6E:
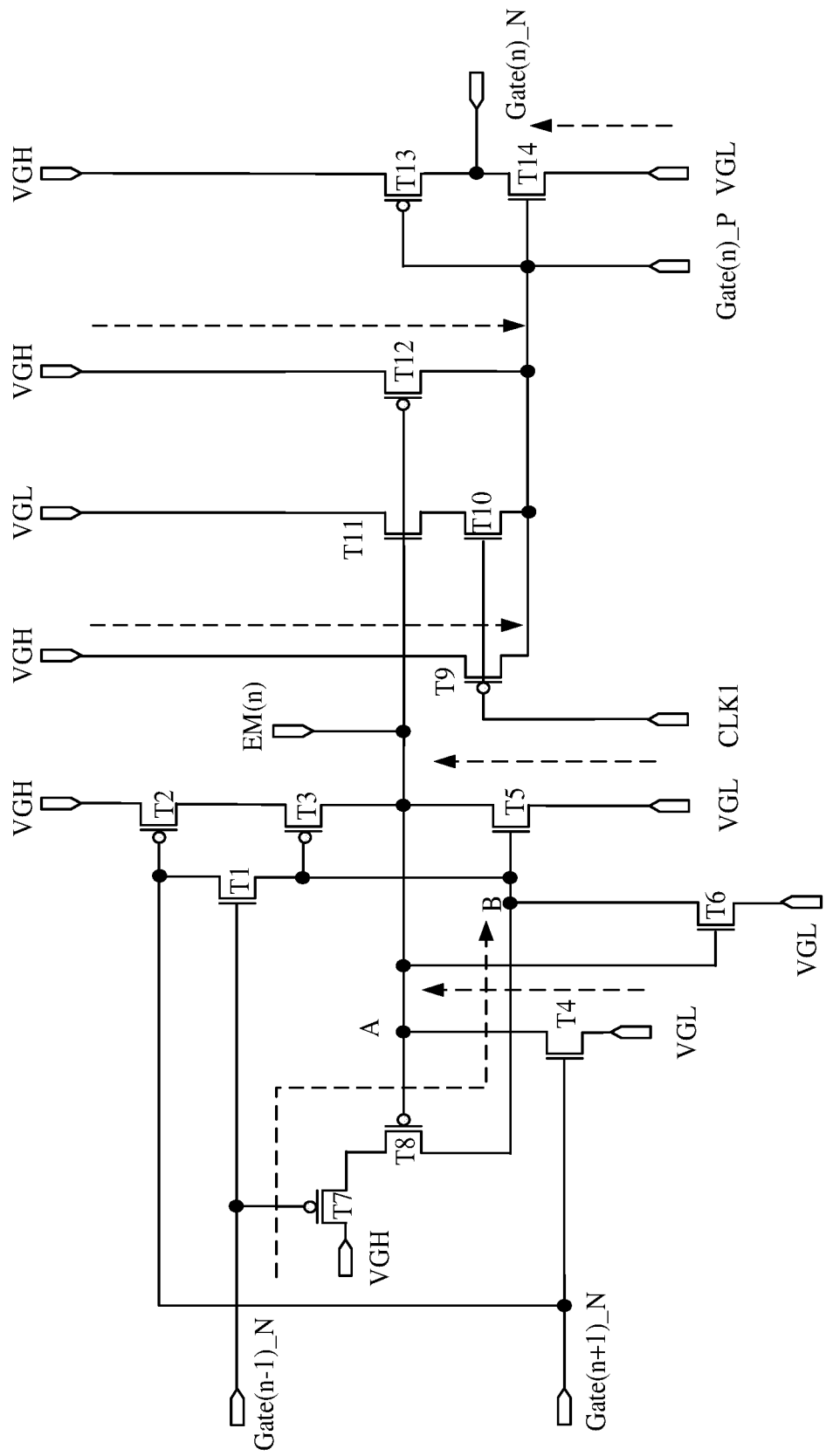
Figure 6F:
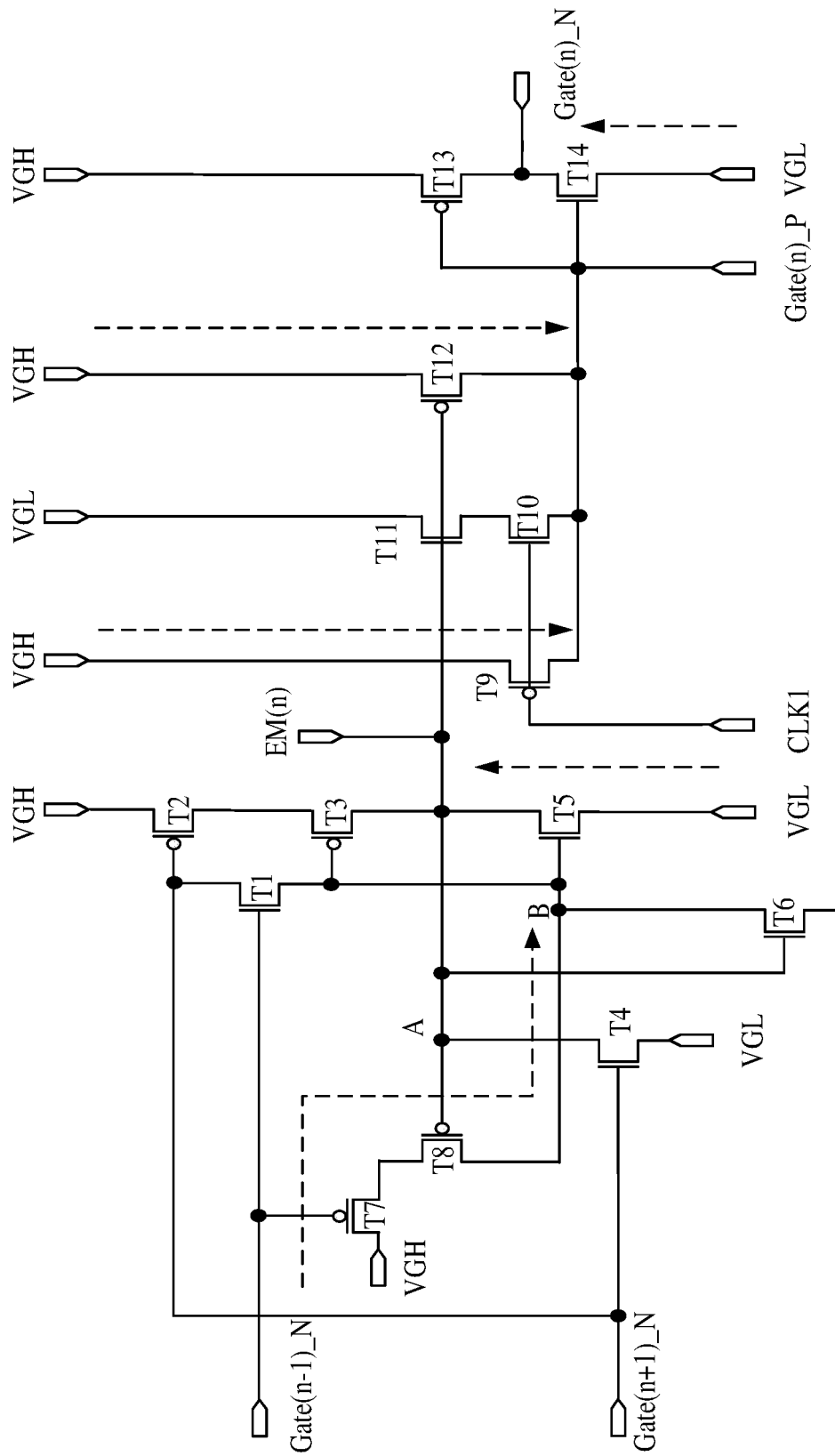

FIG. 6A shows an equivalent circuit diagram of the shift register in a first stage S1 according to an embodiment of the present disclosure. FIG. 6B shows an equivalent circuit diagram of the shift register in a second stage S2 according to an embodiment of the present disclosure. FIG. 6C shows an equivalent circuit diagram of the shift register in a third stage S3 according to an embodiment of the present disclosure. FIG. 6D shows an equivalent circuit diagram of the shift register in a fourth stage S4 according to an embodiment of the present disclosure. FIG. 6E shows an equivalent circuit diagram of the shift register in a fifth stage S6 according to an embodiment of the present disclosure. FIG. 6F shows an equivalent circuit diagram of the shift register in a sixth stage S5 according to an embodiment the present disclosure. Dashed lines with arrows in FIG. 6C to FIG. 6F represent current directions of the shift register in corresponding stages.

Next, with reference to FIG. 6A to FIG. 6F, operations of the shift register according to an embodiment of the present disclosure will be described in detail.

In the first stage S1, the first input signal Gate(n−1)_N is at a high level, the second input signal Gate(n+1)_N is at a low level, and the first clock signal CLK1 is at a low level.

Under the control of the first input signal Gate(n−1)_N, the first transistor T1 is turned on, and the seventh transistor T7 is turned off by the high level of the first input signal Gate(n−1)_N. The second input signal Gate(n+1)_N is provided to the gate of the third transistor T3 through the first transistor T1. Under the control of the second input signal Gate(n+1)_N, the second transistor T2 and the third transistor T3 are turned on, and the fourth transistor T4 is turned off by the low level of the second input signal Gate(n+1)_N.

The first power supply voltage VGH is provided to the first node A through the second transistor T2 and the third transistor T3. At this time, the potential of the first node A is at a high level, and the light-emitting control signal EM(n) output by the light-emitting control signal terminal EM(n) is at a high level.

Under the control of the high level of the first node A, the sixth transistor T6 is turned on. The eighth transistor T8 is turned off by the high level of the first node A. The second power supply voltage VGL is provided to the second node B through the sixth transistor T6. At this time, the potential of the second node B is at a low level.

The second node B is electrically connected to the gate of the third transistor T3. Under the control of the low level of the second node B, the third transistor T3 remains in a conductive state, and the fifth transistor T5 is turned off by the low level of the second node B. When the third transistor T3 remains in a conductive state, the first power supply voltage VGH may be stably provided to the light-emitting control signal terminal EM(n) to form a stable feedback, so that the light-emitting control signal terminal EM(n) may output a stable light-emitting control signal EM(n).

Under the control of the high level of the first node A, the eleventh transistor T11 is turned on. The twelfth transistor T12 is turned off by the high level of the first node A. Under the control of the first clock signal CLK, the ninth transistor T9 is turned on. The tenth transistor T10 is turned off by the low level of the first clock signal CLK. The first voltage power supply VGH is provided to the first output scanning signal terminal Gate(n)_P through the ninth transistor T9. At this time, the gate driving signal Gate(n)_P output by the first output scanning signal terminal Gate(n)_P is at a high level.

Under the control of the high level of the first output scanning signal terminal Gate(n)_P, the fourteenth transistor T14 is turned on. The thirteenth transistor T13 is turned off by the high level of the first output signal terminal Gate(n)_P. The second power supply voltage VGL is provided to the second output scanning signal terminal Gate(n)_N through the fourteenth transistor T14. At this time, the gate driving signal Gate(n)_N output by the second output scanning signal terminal Gate (n)_N is at a low level.

In the second stage S2, the first input signal Gate(n−1)_N is at a low level, the second input signal Gate(n+1)_N is at a low level, and the first clock signal CLK1 is at a low level.

Under the control of the first input signal Gate(n−1)_N, the seventh transistor T7 is turned on, and the first transistor T1 is turned off by the low level of the first input signal Gate(n−1)_N. Under the control of the second input signal Gate(n+1)_N, the second transistor T2 is turned on, and the fourth transistor T4 is turned off by the low level of the second input signal Gate(n+1)_N.

Since the third transistor T3 is in a locked state in a case that the gate of the third transistor T3 does not receive an external voltage, the third transistor T3 remains in the same conductive state as the first stage S1. The first power supply voltage VGH is provided to the first node A through the second transistor T2 and the third transistor T3. At this time, the potential of the first node A is at a high level, and the light-emitting control signal EM(n) output by the light-emitting control signal terminal EM(n) is at a high level.

Under the control of the high level of the first node A, the sixth transistor T6 is turned on. The eighth transistor T8 is turned off by the high level of the first node A. The second power supply voltage VGL is provided to the second node B through the sixth transistor T6. At this time, the potential of the second node B is at a low level.

Under the control of the low level of the second node B, the third transistor T3 remains in a conductive state, and the fifth transistor T5 is turned off by the low level of the second node B. When the third transistor T3 remains in the conductive state, the first power supply voltage VGH may be stably provided to the light-emitting control signal terminal EM(n) to form a stable feedback, so that the light-emitting control signal terminal EM(n) may output a stable light-emitting control signal EM(n).

Under the control of the high level of the first node A, the eleventh transistor T11 is turned on. The twelfth transistor T12 is turned off by the high level of the first node A. Under the control of the first clock signal CLK, the ninth transistor T9 is turned on. The tenth transistor T10 is turned off by the low level of the first clock signal CLK. The first voltage power supply VGH is provided to the first output scanning signal terminal Gate(n)_P through the ninth transistor T9. At this time, the gate driving signal Gate(n)_P output by the first output scanning signal terminal Gate(n)_P is at a high level.

Under the control of the high level of the first output scanning signal terminal Gate(n)_P, the fourteenth transistor T14 is turned on. The thirteenth transistor T13 is turned off by the high level of the first output signal terminal Gate(n)_P. The second power supply voltage VGL is provided to the second output scanning signal terminal Gate(n)_N through the fourteenth transistor T14. At this time, the gate driving signal Gate(n)_N output by the second output scanning signal terminal Gate(n)_N is at a low level.

In the third stage S3, the first input signal Gate(n−1)_N is at a low level, the second input signal Gate(n+1)_N is at a low level, and the first clock signal CLK1 is at a high level.

Under the control of the first input signal Gate(n−1)_N, the seventh transistor T7 is turned on, and the first transistor T1 is turned off by the low level of the first input signal Gate(n−1)_N. Under the control of the second input signal Gate(n+1)_N, the second transistor T2 is turned on, and the fourth transistor T4 is turned off by the low level of the second input signal Gate(n+1)_N.

Since the third transistor T3 is in a locked state in a case that the gate of the third transistor T3 does not receive an external voltage, the third transistor T3 remains in the same conductive state as the second stage S2. The first power supply voltage VGH is provided to the first node A through the second transistor T2 and the third transistor T3. At this time, the potential of the first node A is at a high level, and the light-emitting control signal EM(n) output by the light-emitting control signal terminal EM(n) is at a high level.

Under the control of the high level of the first node A, the sixth transistor T6 is turned on. The eighth transistor T8 is turned off by the high level of the first node A. The second power supply voltage VGL is provided to the second node B through the sixth transistor T6. At this time, the potential of the second node B is at a low level.

Under the control of the low level of the second node B, the third transistor T3 remains in a conductive state, and the fifth transistor T5 is turned off by the low level of the second node B. When the third transistor T3 remains in a conductive state, the first power supply voltage VGH may be stably provided to the light-emitting control signal terminal EM(n) to form a stable feedback, so that the light-emitting control signal terminal EM(n) may output a stable light-emitting control signal EM(n).

Under the control of the high level of the first node A, the eleventh transistor T11 is conducted. The twelfth transistor T12 is turned off by the high level of the first node A. Under the control of the first clock signal CLK, the tenth transistor T10 is conducted. The ninth transistor T9 is turned off by the low level of the first clock signal CLK. The second voltage power supply VGL is provided to the first output scanning signal terminal Gate(n)_P through the eleventh transistor T11 and the tenth transistor T10. At this time, the gate driving signal Gate(n)_P output by the first output scanning signal terminal Gate(n)_P is at a low level.

Under the control of the low level of the first output scanning signal terminal Gate(n)_P, the thirteenth transistor T13 is conducted. The fourteenth transistor T14 is turned off by the high level of the first output signal terminal Gate(n)_P. The first power supply voltage VGH is provided to the second output scanning signal terminal Gate(n)_N through the fourteenth transistor T14. At this time, the gate driving signal Gate(n)_N output by the second output scanning signal terminal Gate(n)_N is at a high level.

In the fourth stage S4, the first input signal Gate(n−1)_N is at a low level, the second input signal Gate(n+1)_N is at a low level, and the first clock signal CLK1 is at a low level.

Under the control of the first input signal Gate(n−1)_N, the seventh transistor T7 is turned on, and the first transistor T1 is turned off by the low level of the first input signal Gate(n−1)_N. Under the control of the second input signal Gate(n+1)_N, the second transistor T2 is turned on, and the fourth transistor T4 is turned off by the low level of the second input signal Gate(n+1)_N.

Since the third transistor T3 is in a locked state in a case that the gate of the third transistor T3 does not receive an external voltage, the third transistor T3 remains in the same conductive state as the third stage S3. The first power supply voltage VGH is provided to the first node A through the second transistor T2 and the third transistor T3. At this time, the potential of the first node A is at a high level, and the light-emitting control signal EM(n) output by the light-emitting control signal terminal EM(n) is at a high level.

Under the control of the high level of the first node A, the sixth transistor T6 is turned on. The eighth transistor T8 is turned off by the high level of the first node A. The second power supply voltage VGL is provided to the second node B through the sixth transistor T6. At this time, the potential of the second node B is at a low level.

Under the control of the low level of the second node B, the third transistor T3 remains in a conductive state, and the fifth transistor T5 is turned off by the low level of the second node B. When the third transistor T3 remains in a conductive state, the first power supply voltage VGH may be stably provided to the light-emitting control signal terminal EM(n) to form a stable feedback, so that the light-emitting control signal terminal EM(n) may output a stable light-emitting control signal EM(n).

Under the control of the high level of the first node A, the eleventh transistor T11 is turned on. The twelfth transistor T12 is turned off by the high level of the first node A. Under the control of the first clock signal CLK, the ninth transistor T9 is turned on. The tenth transistor T10 is turned off by the low level of the first clock signal CLK. The first power supply voltage VGH is provided to the first output scanning signal terminal Gate(n)_P through the ninth transistor T9. At this time, the gate driving signal Gate(n)_P output by the first output scanning signal terminal Gate(n)_P is at a high level.

Under the control of the high level of the first output scanning signal terminal Gate(n)_P, the fourteenth transistor T14 is turned on. The thirteenth transistor T13 is turned off by the low level of the first output signal terminal Gate(n)_P. The second voltage power supply VGL is provided to the second output scanning signal terminal Gate(n)_N through the fourteenth transistor T14. At this time, the gate driving signal Gate(n)_N output by the second output scanning signal terminal Gate(n)_N is at a low level.

In the fifth stage S5, the first input signal Gate(n−1)_N is at a low level, the second input signal Gate(n+1)_N is at a high level, and the first clock signal CLK1 is at a low level.

Under the control of the first input signal Gate(n−1)_N, the seventh transistor T7 is turned on, and the first transistor T1 is turned off by the low level of the first input signal Gate(n−1)_N. Under the control of the second input signal Gate(n+1)_N, the fourth transistor T4 is turned on, and the second transistor T2 is turned off by the low level of the second input signal Gate(n+1)_N. The second power supply voltage VGL is provided to the first node A through the fourth transistor T4. At this time, the potential of the first node A is at a low level, and the light-emitting control signal EM(n) output by the light-emitting control signal terminal EM(n) is at a low level.

Under the control of the low level of the first node A, the eighth transistor T8 is turned on. The sixth transistor T6 is turned off by the low level of the first node A. The first power supply voltage VGH is provided to the second node B through the seventh transistor T7 and the eighth transistor T8. At this time, the potential of the second node B is at a high level.

Under the control of the high level of the second node B, the fifth transistor T5 is turned on, and the third transistor T3 is turned off by the low level of the second node B. When the fifth transistor T5 is in a conductive state, the second power supply voltage VGL may be stably provided to the light-emitting control signal terminal EM(n) to form a stable feedback, so that the light-emitting control signal terminal EM(n) may output a stable light-emitting control signal EM(n).

Under the control of the low level of the first node A, the twelfth transistor T12 is turned on. The eleventh transistor T11 is turned off by the low level of the first node A. Under the control of the first clock signal CLK, the ninth transistor T9 is turned on. The tenth transistor T10 is turned off by the low level of the first clock signal CLK. The first power supply voltage VGH is provided to the first output scanning signal terminal Gate(n)_P through the ninth transistor T9 and the twelfth transistor T12. At this time, the gate driving signal Gate(n)_P output by the first output scanning signal terminal Gate(n)_P is at a high level.

Under the control of the high level of the first output scanning signal terminal Gate(n)_P, the fourteenth transistor T14 is turned on. The thirteenth transistor T13 is turned off by the low level of the first output signal terminal Gate(n)_P. The second voltage power supply VGL is provided to the second output scanning signal terminal Gate(n)_N through the fourteenth transistor T14. At this time, the gate driving signal Gate(n)_N output by the second output scanning signal terminal Gate(n)_N is at a low level.

In the sixth stage S6, the first input signal Gate(n−1)_N is at a low level, the second input signal Gate(n+1)_N is at a low level, and the first clock signal CLK1 is at a low level.

Under the control of the first input signal Gate(n−1)_N, the seventh transistor T7 is turned on, and the first transistor T1 is turned off by the low level of the first input signal Gate(n−1)_N. Under the control of the second input signal Gate(n+1)_N, the second transistor T2 is turned on, and the fourth transistor T4 is turned off by the low level of the second input signal Gate(n+1)_N.

Since the fifth transistor T5 is in a locked state in a case that the gate of the fifth transistor T5 does not receive an external voltage, the fifth transistor T5 remains in the same conductive state as the fifth stage S5. The second power supply voltage VGL is provided to the first node A through the fifth transistor T5. At this time, the potential of the first node A is at a low level, and the light-emitting control signal EM(n) output by the light-emitting control signal terminal EM(n) is at a low level.

Under the control of the low level of the first node A, the eighth transistor T8 is turned on. The sixth transistor T6 is turned off by the low level of the first node A. The first power supply voltage VGH is provided to the second node B through the seventh transistor T7 and the eighth transistor T8. At this time, the potential of the second node B is at a high level.

Under the control of the high level of the second node B, the fifth transistor T5 remains in a conductive state, and the third transistor T3 is turned off by the low level of the second node B. When the fifth transistor T5 remains in a conductive state, the second power supply voltage VGL may be stably provided to the light-emitting control signal terminal EM(n) to form a stable feedback, so that the light-emitting control signal terminal EM(n) may output a stable light-emitting control signal EM(n).

Under the control of the low level of the first node A, the twelfth transistor T12 is turned on. The eleventh transistor T11 is turned off by the low level of the first node A. Under the control of the first clock signal CLK, the ninth transistor T9 is turned on. The tenth transistor T10 is turned off by the low level of the first clock signal CLK. The first power supply voltage VGH is provided to the first output scanning signal terminal Gate(n)_P through the ninth transistor T9 and the twelfth transistor T12. At this time, the gate driving signal Gate(n)_P output by the first output scanning signal terminal Gate(n)_P is at a high level.

Under the control of the high level of the first output scanning signal terminal Gate(n)_P, the fourteenth transistor T14 is turned on. The thirteenth transistor T13 is turned off by the low level of the first output signal terminal Gate(n)_P. The second voltage power supply VGL is provided to the second output scanning signal terminal Gate(n)_N through the fourteenth transistor T14. At this time, the gate driving signal Gate(n)_N output by the second output scanning signal terminal Gate(n)_N is at a low level.

In the example of FIG. 5A and FIG. 6A to FIG. 6F, the first transistor T1, the fourth transistor T4, the fifth transistor T5, the sixth transistor T6, the tenth transistor T10, the eleventh transistor T11 and the fourteenth transistor T14 are N-type transistors. The second transistor T2, the third transistor T3, the seventh transistor T7, the eighth transistor T8, the ninth transistor T9, the twelfth transistor T12 and the thirteenth transistor T13 are P-type transistors. Those of skill in the art may understand that, according to an embodiment of the present disclosure, the first transistor T1, the fourth transistor T4, the fifth transistor T5, the sixth transistor T6, the tenth transistor T10, the eleventh transistor T11 and the fourteenth transistor T14 may also be P-type transistors. The second transistor T2, the third transistor T3, the seventh transistor T7, the eighth transistor T8, the ninth transistor T9, the twelfth transistor T12 and the thirteenth transistor T13 may also be N-type transistors, and a level of a gate conduction signal of each transistor may be changed accordingly.

In an embodiment of the present disclosure, among a plurality of shift registers 500 which are cascaded, a first clock signal terminal CLK1 of an odd numbered shift register unit is electrically connected to the clock signal terminal CLK to receive a clock signal CLK, and a first clock signal terminal CLK1 of an even numbered shift register unit is electrically connected to a clock signal terminal CLB to receive a clock signal CLB.

For example, the clock signal CLB and the clock signal CLK alternate high levels in timing. For example, the shift register 500 may be an $n^{th}$ shift register, where n is a positive integer and n is an odd number greater than 1. The $n^{th}$ shift register receives the clock signal CLK, while an $(n-1)^{th}$ shift register and an $(n+1)^{th}$ shift register receive the clock signal CLB.

For example, the odd numbered shift register unit writes the high level of the clock signal CLK into the gate driving signal Gate(n)_N. The even numbered shift register units write the high level of the clock signal CLB into the gate driving signal Gate(n+1)_N and the gate driving signal Gate(n−1)_N.

In the shift register 500 provided in the present disclosure, the light-emitting control signal EM(n) is output by controlling the first transistor T1, the second transistor T2, the third transistor T3, the fourth transistor T4 and the fifth transistor T5. By controlling the sixth transistor T6, the seventh transistor T7 and the eighth transistor T8, a stable output of the light-emitting control signal EM(n) is maintained. By controlling the ninth transistor T9, the tenth transistor T10, the eleventh transistor T11 and the twelfth transistor T12, the gate driving signal Gate(n)_P is output. By controlling the thirteenth transistor T13 and the fourteenth transistor T14, the gate driving signal Gate(n)_N is output. The shift register 500 provided in the present disclosure may provide a gate driving signal Gate(n)_N, a gate driving signal Gate(n)_P and a light-emitting control signal EM(n) for a corresponding row of pixel units in a pixel array, thereby reducing the space occupied by the driving circuit, which is beneficial for narrowing the frame of the display. In addition, the shift register 500 provided in the present disclosure does not have a capacitor structure, and the stable output of the light-emitting control signal EM(n) is maintained through a transistor structure, so that the output light-emitting control signal EM(n) has no floating phenomenon.

Figure 7A:
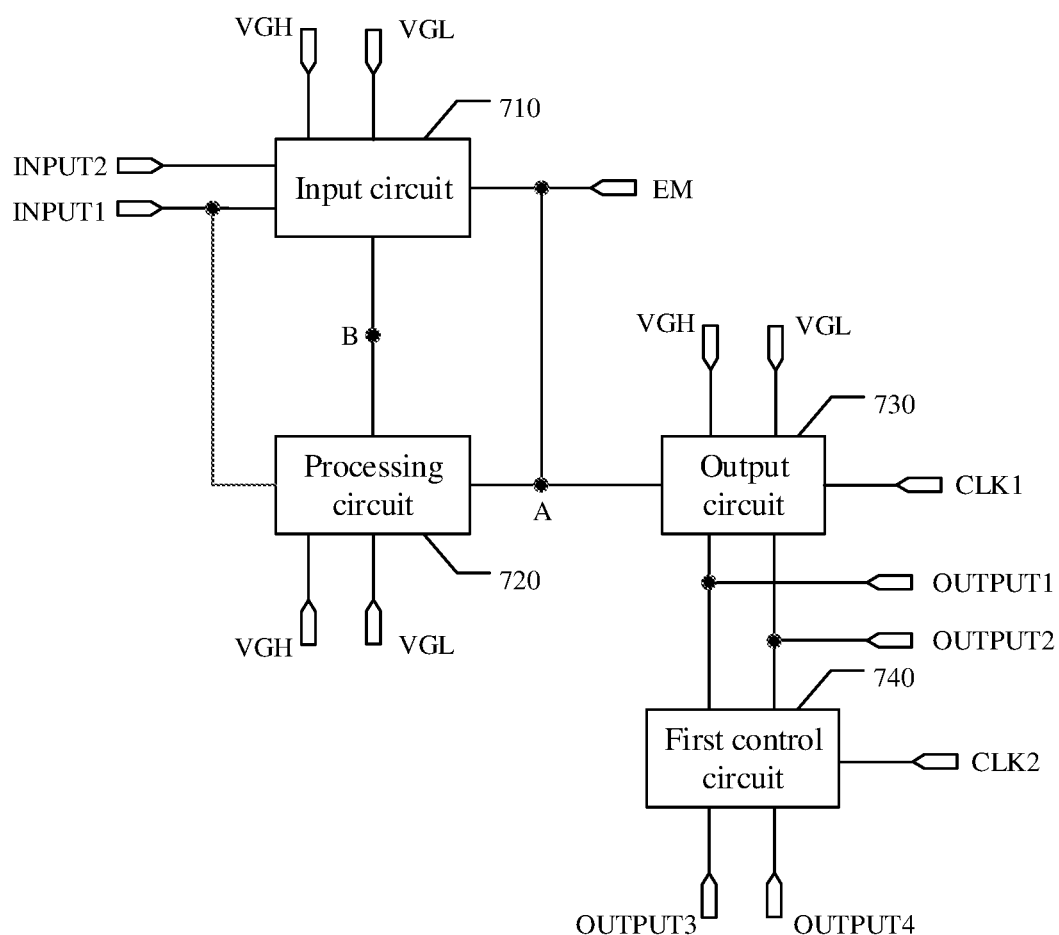
FIG. 7A is a schematic diagram of a structure of a shift register according to another embodiment of the present disclosure.

FIG. 7 is a schematic diagram of a structure of a shift register according to another embodiment of the present disclosure.

As shown in FIG. 7, the shift register 700 includes an input circuit 710, a processing circuit 720, an output circuit 730 and a first control circuit 740. The input circuit 710, the processing circuit 720 and the output circuit 730 are similar to the input circuit 510, the processing circuit 520 and the output circuit 530 mentioned in the previous description, respectively. For simplicity, the same parts will not be repeated herein.

In an embodiment of the present disclosure, the first control circuit 740 is electrically connected to a second clock signal terminal CLK2, the first output scanning signal terminal OUTPUT1, the second output scanning signal terminal OUTPUT2, a third output scanning signal terminal OUTPUT3, and a fourth output scanning signal terminal OUTPUT4.

Under a control of the second clock signal from the second clock signal terminal CLK2, the first control circuit 740 provides the potential of the first output scanning signal terminal OUTPUT1 to the third output scanning signal terminal OUTPUT3, and the first control circuit 740 also provides a potential of the second output scanning signal terminal OUTPUT2 to the fourth output scanning signal terminal OUTPUT4.

In an embodiment of the present disclosure, the first control circuit 740 and the output circuit 730 are electrically connected to the first output scanning signal terminal OUTPUT1 and the second output scanning signal terminal OUTPUT2. The output circuit 730 outputs the gate driving signal Gate(n)_P and the gate driving signal Gate(n)_N through the first output scanning signal terminal OUTPUT1 and the second output scanning signal terminal OUTPUT2, respectively. Under the control of the second clock signal CLK2, the first control circuit 740 may control whether to output the gate driving signal Gate(n)_P and the gate driving signal Gate(n)_N to a corresponding pixel row of the pixel array.

For example, the first control circuit 740 may output the gate driving signal Gate(n)_P output by the first output scanning signal terminal OUTPUT1 to the third output scanning signal terminal OUTPUT3. The gate driving signal Gate(n)_P is provided to a corresponding pixel row by the third output scanning signal terminal OUTPUT3. The first control circuit 740 may output the gate driving signal Gate(n)_N output by the second output scanning signal terminal OUTPUT2 to the fourth output scanning signal terminal OUTPUT4. The gate driving signal Gate(n)_N is provided to a corresponding pixel row by the fourth output scanning signal terminal OUTPUT4.

For example, the first control circuit 740 may also control to output the gate driving signal Gate(n)_P not output by the first output scanning signal terminal OUTPUT1 to the third output scanning signal terminal OUTPUT3, and control not to output the gate driving signal Gate(n)_N output by the second output scanning signal terminal OUTPUT2 to the fourth output scanning signal terminal OUTPUT4.

In an embodiment of the present disclosure, the shift register 700 may be used to set different refresh frequencies for different pixel rows of the pixel array. For example, a display screen may include a static screen and a dynamic screen. For example, the static screen may be a background part of the display screen that remains unchanged, while a dynamic screen may be a part of the display screen that changes. When the screen is shown on the display, the static screen may appear in the display screen for a period of time. If the static screen and the dynamic screen are refreshed at the same refresh rate (for example, high frequency), significant power consumption will be generated. If the dynamic screen part is set to maintain to be refreshed at the original high refresh frequency, and the static screen part is refreshed at a relatively low refresh frequency, it is possible to reduce refreshing power consumption.

For example, a frame refresh rate of the dynamic screen may be set to 120 Hz. Within 1 second, the display screen is refreshed by 120 frames.

Correspondingly, a frame refresh rate of the static screen may be set to 60 Hz or 30 Hz. When the frame refresh rate is 60 Hz, the display screen will be refreshed by 60 frames within 1 second. When the frame refresh rate is 30 Hz, the display screen will be refreshed by 30 frames within 1 second.

In order to achieve a frame refresh rate of 120 Hz on the display screen, the plurality of shift registers 700 which are cascaded provide the gate driving signal Gate(n)_N the gate driving signal Gate(n)_P to the first output scanning signal terminal OUTPUT1 and the second output scanning signal terminal OUTPUT2, respectively, for the pixel array.

In this case, for pixel rows displaying the dynamic screen in the pixel array, the corresponding shift register 700 may provide all of the gate driving signal Gate(n)_P output by the first output scanning signal terminal OUTPUT1 to the third output scanning signal terminal OUTPUT3, and provide all of the gate driving signal Gate(n)_N output by the second output scanning signal terminal OUTPUT2 to the fourth output scanning signal terminal OUTPUT4, so that the pixel rows displaying the dynamic screen may refresh 120 frames per second, thereby achieving a frame refresh rate of 120 Hz.

For pixel rows displaying the static screen in the pixel array, the corresponding shift register 700 may provide part of the gate driving signal Gate(n)_P output by the first output scanning signal terminal OUTPUT1 to the third output scanning signal terminal OUTPUT3, and provide part of the gate driving signal Gate(n)_N output by the second output scanning signal terminal OUTPUT2 to the fourth output scanning signal terminal OUTPUT4, thereby reducing the refresh times of the pixel rows displaying the static screen.

Figure 7B:
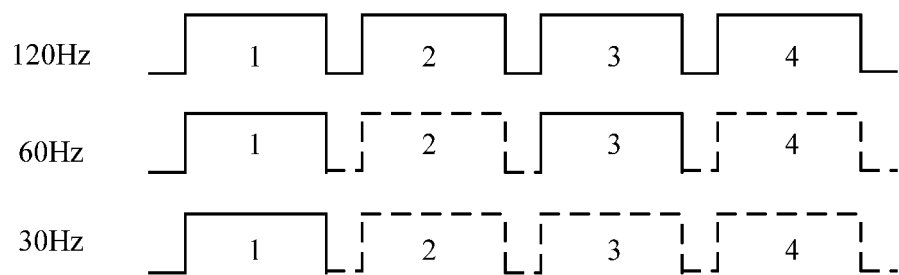
FIG. 7B is a schematic diagram of refreshing a pixel array according to an embodiment of the present disclosure.

FIG. 7B is a schematic diagram of refreshing a pixel array according to an embodiment of the present disclosure.

As shown in FIG. 7B, the frame refresh rate of 120 Hz is taken as a reference, the 120 frames of screen displayed per second are divided into four parts according to the order of display. For example, the first part is the screen from the first frame to the thirtieth frame, the second part is the screen from the thirty-first frame to the sixtieth frame, the third part is the screen from the sixty-first frame to the ninetieth frame, and the fourth part is the screen from the ninety-first frame to the one hundred and twentieth frame.

When the frame refresh rate is set to 120 Hz, it may be determined that the pixel array displays data in four parts per second. In a case that only the first and third parts of the data are displayed in the pixel array per second, it may be determined that the frame refresh rate is equivalent to 60 Hz. In a case that only the first part of the data is displayed in the pixel array per second, it may be determined that the frame refresh rate is equivalent to 30 Hz.

As shown in FIG. 7B, the solid line represents the displayed data, and the dashed line represents the data that is not displayed. Understandably, pixels are refreshed at the same speed in each row of the pixel array. When each frame of the display screen is refreshed, a plurality of pixel rows may be refreshed line by line. When the display screen is refreshed 120 frames within 1 second, the plurality of pixel rows are refreshed 120 times row by row. For example, the pixel array may include 2000 rows of pixels. After refreshing each row from the first row of pixels to the 2000th row of pixels, the display screen completes a refresh of one frame.

For pixel rows displaying the dynamic screen in a pixel array, the pixel row is set to be refreshed 120 times per second, thus it may be determined as equivalent to a refresh rate of 120 Hz. For pixel rows displaying the static screen in the pixel array, in each second, only the first 30 times of refreshing are performed on the pixel row and the last 90 times of refreshing are not performed, thus it may be determined that the refresh rate of this pixel row is equivalent to 30 Hz. For pixel rows displaying the static screen in the pixel array, in each second, only the first 30 times and the sixty-first to ninetieth times of refreshing are performed on the pixel row, and the thirty-first to sixtieth times and the last 30 times of refreshing are not performed, thus it may be determined that the refresh rate of this pixel row is equivalent to 60 Hz.

When the pixel row is set to be refreshed for only the first 30 times per second, the corresponding shift register provides the gate driving signal Gate(n)_N and the gate driving signal Gate(n)_P only in the refreshing of the first 30 times. When the pixel row is set to be refreshed for only the first 30 times and the sixty-first to ninetieth times per second, the corresponding shift register provides the gate driving signal Gate(n)_N and the gate driving signal Gate(n)_P only in the refreshing of the first 30 times and the sixty-first to ninetieth times.

For example, the shift register may provide a gate driving signal Gate(n)_N and a gate driving signal Gate(n)_P that are refreshed once for the corresponding 3 pixel rows (an $(n-1)^{th}$ row, an $n^{th}$ row, and an $(n+1)^{th}$ row) after each process of the first stage S1 to the sixth stage S6 mentioned in the previous description.

In an embodiment of the present disclosure, the frame refresh rate of the dynamic screen may be set to 120 Hz, and the frame refresh rate of the static screen may be set to 30 Hz. Correspondingly, under the control of the second clock signal CLK2, the first control circuit 740 in the shift register 700 corresponding to the pixel rows of the dynamic screen may be set to be in a conductive state in the 120 refreshing processes. All of the gate driving signal Gate(n)_P output by the first output scanning signal terminal OUTPUT1 may be provided to the third output scanning signal terminal OUTPUT3, and all of the gate driving signal Gate(n)_N output from the second output scanning signal terminal OUTPUT2 may be provided to the fourth output scanning signal terminal OUTPUT4. Under the control of the second clock signal CLK2, the first control circuit 740 in the shift register 700 corresponding to the pixel rows of the static screen may be set to be in a conductive state only in the first 30 refreshing processes, and be set to be in a turned-off state in the last 90 refreshing processes. Therefore, only in the first 30 refreshing processes, all of the gate driving signal Gate(n)_P output by the first output scanning signal terminal OUTPUT1 may be provided to the third output scanning signal terminal OUTPUT3, and all of the gate driving signal Gate(n)_N output by the second output scanning signal terminal OUTPUT2 may be provided to the fourth output scanning signal terminal OUTPUT4. In the thirty-first to one-hundred and twentieth refreshing processes, the gate driving signal Gate(n)_P output by the first output scanning signal terminal OUTPUT1 is not provided to the third output scanning signal terminal OUTPUT3, the gate driving signal Gate(n)_N output by the second output scanning signal terminal OUTPUT2 is not provided to the fourth output scanning signal terminal OUTPUT4, and the pixel rows of the static screen are not refreshed, thereby maintaining to display the screen displayed by the refreshing of the first 30 times.

In an embodiment of the present disclosure, the refresh rate of pixel rows in the dynamic screen may be set to 120 Hz, and the refresh rate of pixel rows in the static screen may be set to 60 Hz. Correspondingly, under the control of the second clock signal CLK2, the first control circuit 740 in the shift register 700 corresponding to the pixel rows of the dynamic screen may be set to be in a conductive state in the 120 refreshing processes. All of the gate driving signal Gate(n)_P output by the first output scanning signal terminal OUTPUT1 may be provided to the third output scanning signal terminal OUTPUT3, and all of the gate driving signal Gate(n)_N output by the second output scanning signal terminal OUTPUT2 may be provided to the fourth output scanning signal terminal OUTPUT4. Under the control of the second clock signal CLK2, the first control circuit 740 in the shift register 700 corresponding to the pixel rows of the static screen may be set to be in a conductive state only in the first 30 and the sixty-first to ninetieth refreshing processes, and be set to be in a turned-off state in the thirty-first to sixtieth and the last 30 refreshing processes. Therefore, only in the first 30 and the thirty-first to ninetieth refreshing processes, all of the gate driving signal Gate(n)_P output by the first output scanning signal terminal OUTPUT1 may be provided to the third output scanning signal terminal OUTPUT3, and all of the gate driving signal Gate(n)_N output by the second output scanning signal terminal OUTPUT2 may be provided to the fourth output scanning signal terminal OUTPUT4. In the refreshing processes of the thirty-first to sixtieth times, the pixel rows of the static screen are not refreshed, and the screen displayed in the first 30 refreshes is maintained. In the ninety-first to one-hundred and twentieth refresh processes, the pixel rows of the static screen are not refreshed, and the screen displayed in the sixty-first to ninetieth refreshes is maintained.

Through the embodiment of the present disclosure, by providing the first control circuit 740, output periods of the gate driving signal Gate(n)_N and the gate driving signal Gate(n)_P are controlled, so that the refresh rate of different regions in the pixel array may be flexibly controlled, thereby achieving different regions in the pixel array to refresh at different refresh rates to reduce refreshing power consumption.

Figure 8A:
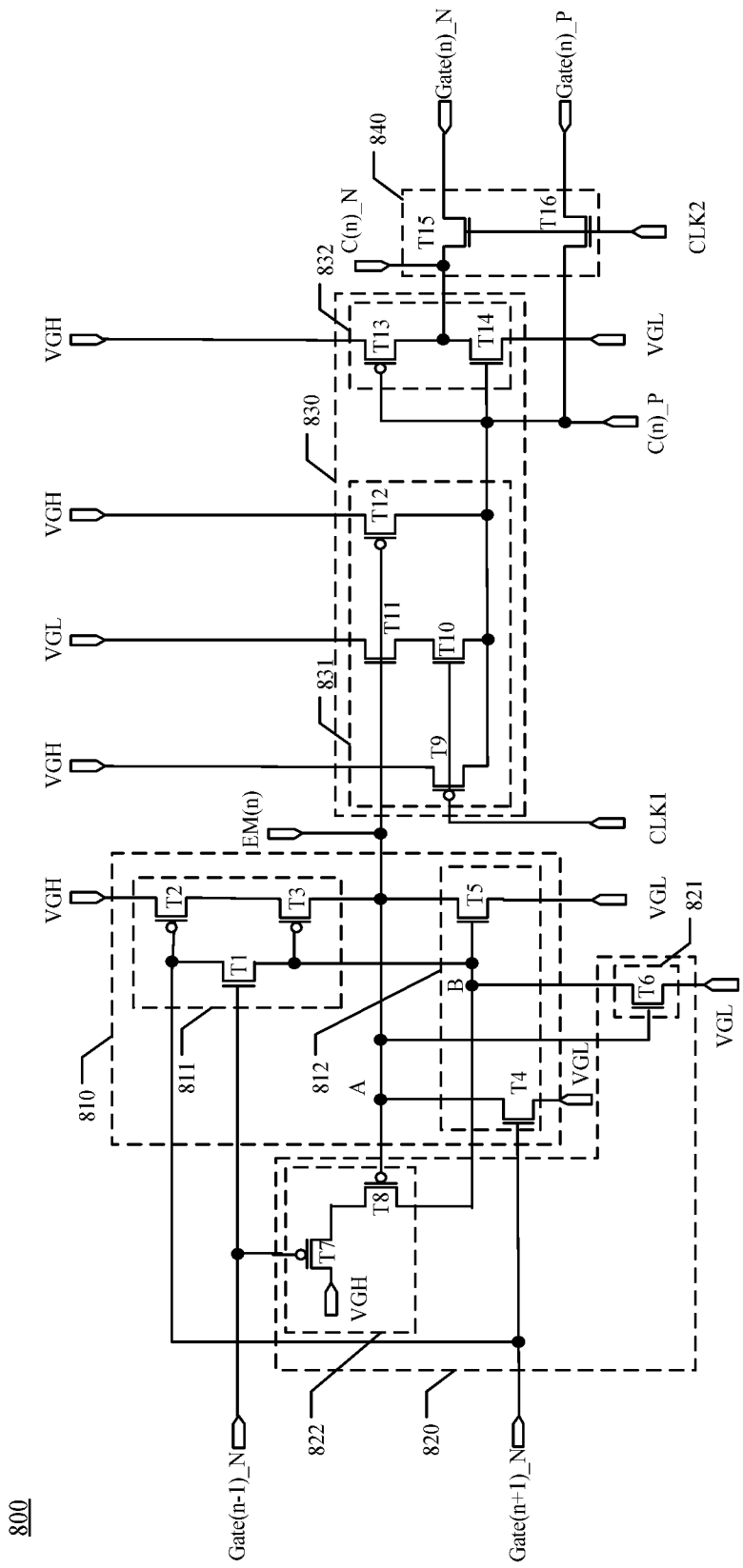
FIG. 8A is a schematic diagram of a structure of a shift register according to another embodiment of the present disclosure.

FIG. 8A is a schematic diagram of a structure of a shift register according to another embodiment of the present disclosure.

As shown in FIG. 8A, the shift register 800 includes an input circuit 810, a processing circuit 820, an output circuit 830 and a first control circuit 840.

The input circuit 810 includes a first input sub-circuit 811 and a second input sub-circuit 812. The processing circuit 820 includes a first processing sub-circuit 821 and a second processing sub-circuit 822. The output circuit 830 includes a first output sub-circuit 831 and a second output sub-circuit 832.

The input circuit 810, the processing circuit 820, the output circuit 830, and the first control circuit 840 are similar to the input circuit 710, the processing circuit 720, the output circuit 730, and the first control circuit 740 mentioned in the previous description, respectively. The first input sub-circuit 811 and the second input sub-circuit 812 are similar to the first input sub-circuit 511 and the second input sub-circuit 512 mentioned in the previous description, respectively, The first processing sub-circuit 821 and the second processing sub-circuit 822 are similar to the first processing sub-circuit 521 and the second processing sub-circuit 522 mentioned in the previous description, respectively. The first output sub-circuit 831 and the second output sub-circuit 832 are similar to the first output sub-circuit 531 and the second output sub-circuit 532 mentioned in the previous description, respectively. For simplicity, the same parts will not be repeated herein.

In an embodiment of the present disclosure, the first control circuit 840 includes a fifteenth transistor T15 and a sixteenth transistor T16. The fifteenth transistor T15 and the sixteenth transistor T16 are used as switching transistors. The fifteenth transistor T15 and the sixteenth transistor T16 are N-type transistors.

A gate of the fifteenth transistor T15 is electrically connected to the second clock signal terminal CLK2, a first electrode of the fifteenth transistor T15 is electrically connected to an output terminal C(n)_N, and a second electrode of the fifteenth transistor T15 is electrically connected to the fourth output scanning signal terminal Gate(n)_N. The gate driving signal Gate(n)_N is provided to the corresponding pixel row by the fourth output scanning signal terminal Gate(n)_N. In the plurality of shift registers which are cascaded, an output signal C(n)_N output by the output terminal C(n)_N is the input signal Gate(n+1)_N received by a previous shift register, and an output signal C(n)_N output by the output terminal C(n)_N is the input signal Gate(n−1)_N received by a next shift register.

A gate of the sixteenth transistor T16 is electrically connected to the second clock signal terminal CLK2, a first electrode of the sixteenth transistor T16 is electrically connected to the output terminal C(n)_P, and a second electrode of the sixteenth transistor T16 is electrically connected to the third output scanning signal terminal Gate(n)_P. The gate driving signal Gate(n)_P is provided to the corresponding pixel row by the third output scanning signal terminal Gate(n)_P.

Figure 8B:
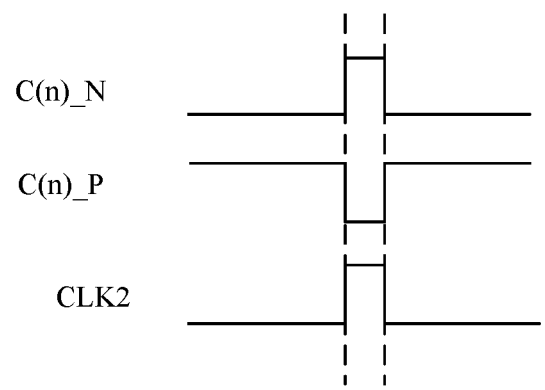
FIG. 8B and FIG. 8C are signal timing diagrams of the shift register in FIG. 8A.
Figure 8C:
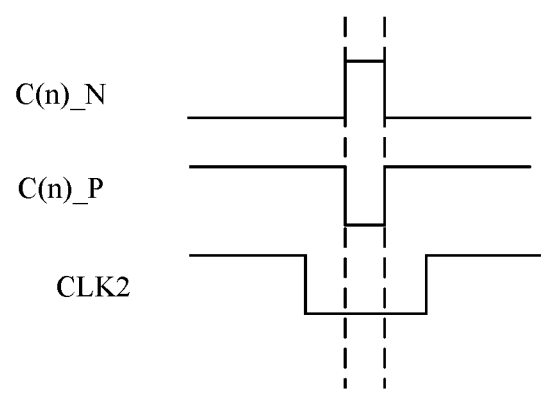

FIG. 8B and FIG. 8C are signal timing diagrams of the shift register in FIG. 8A. FIG. 8B shows a timing waveform of the second clock signal when the third output scanning signal terminal Gate(n)_P and the fourth output scanning signal terminal Gate(n)_N output signals. FIG. 8C shows a timing waveform of the second clock signal when the third output scanning signal terminal Gate(n)_P and the fourth output scanning signal terminal Gate(n)_N do not output signals. Taking the structure of the shift register shown in FIG. 8A as an example, the working process of the shift register provided in the embodiment of the present disclosure will be described with reference to the signal timing diagrams shown in FIG. 8B and FIG. 8C.

In the shift register 800, the working processes of the input circuit 810, processing circuit 820 and output circuit 830 are the same as those shown in FIG. 6A to FIG. 6F. For simplicity, the same parts will not be repeated herein.

As shown in FIG. 8B, the second clock signal CLK2 is at a high level, the output signal C(n)_P output by the first output sub-circuit 831 is at a low level, and the output signal C(n)_N output by the second output sub-circuit 832 is at a high level.

Under the control of the second clock signal CLK2, the fifteenth transistor T15 and the sixteenth transistor T16 are turned on. The output signal C(n)_P is provided to the third output scanning signal terminal Gate(n)_P through the sixteenth transistor T16. The output signal C(n)_N is provided to the fourth output scanning signal terminal Gate(n)_N through the fifteenth transistor T15.

As shown in FIG. 8C, the second clock signal CLK2 is at a low level, the output signal C(n)_P output by the first output sub-circuit 831 is at a low level, and the output signal C(n)_N output by the second output sub-circuit 832 is at a high level.

Under the control of the second clock signal CLK2, the fifteenth transistor T15 and the sixteenth transistor T16 are turned off. The third output scanning signal terminal Gate (n)_P and the fourth output scanning signal terminal Gate (n)_N do not output signals.

It should be noted that the second clock signal CLK2, the output signal C(n)_P and the output signal C(n)_N shown in the FIG. 8B and FIG. 8C are only for illustrative purposes. The timing changes between the second clock signal CLK2, the output signal C(n)_P and the output signal C(n)_N are not limited. Those of skill in the art may set the timing of the second clock signal CLK2 in a specific time period according to actual needs, and control to provide the output signal C(n)_P and the output signal C(n)_N output by a specific shift register in a specific time period to specific pixel rows in the pixel array.

In an embodiment of the present disclosure, it may be determined that at each working period, the gate driving signal output by the shift register 800 may drive a corresponding pixel row to refresh once. When the corresponding pixel row is driven by the shift register, the second clock signal may be set to be at a low level when it is determined that the display data of the pixel row is the same as the previous display data in a current working period. At this time, the corresponding shift register drives to control the control output signal C(n)_P and the output signal C(n)_N not to output. When it is determined that the current display data of a pixel row is different from the previous display data, the second clock signal from the second clock signal terminal is set to be at a high level.

For example, the display data of pixel rows for each working period may be determined based on a data signal provided by the data signal terminal Vdata shown in FIG. 1A. For example, the display data may be a voltage value converted from a pixel value.

For example, before displaying the display data of the current working period, it may be determined in advance that the screen displayed in the display region driven by the shift register is a static screen by comparing the display data of the current working period with the display data of a plurality of working periods before the current working period. For example, the display data in the thirty-first working period is compared with the display data in the first 30 working periods to determine that the display data in the thirty-first working period is the same as the display data in the first 30 working periods. In the thirty-first working period, the second clock signal may be set to be at a low level. At this time, the output signal C(n)_P and the output signal C(n)_N are not output to the corresponding pixel row, and the pixel row corresponding to the shift register 800 is not refreshed.

For example, it is also possible to pre-compare the display data of each pixel row in the plurality of working periods in advance. When it is determined that the display data are the same in the plurality of working periods, the second clock signal may be set to be at a high level in a front part of the working period. At this time, the output signal C(n)_P and the output signal C(n)_N are output to the corresponding pixel row, and the shift register 800 refreshes the corresponding pixel row. In the rest part of the working period, the second clock signal is set to be at a low level. At this time, the output signal C(n)_P and the output signal C(n)_N are not output to the corresponding pixel row, and the pixel row corresponding to the shift register 800 is not refreshed.

For example, in a case that the display data of the 120 working periods are determined to be the same, the second clock signal is set to be at a high level in the first 30 working periods. The second clock signal is set to be at a low level in the last 90 working periods.

For example, it is also possible to compare the display data that has not yet been displayed with the current display data in advance. When it is determined that the display data in the subsequent working period is the same as the current display data, the second clock signal may be set to be at a low level in the subsequent working period. At this time, the output signal C(n)_P and the output signal C(n)_N are not output to the corresponding pixel row, and the pixel row corresponding to the shift register 800 is not refreshed.

For example, by comparing the display data from the thirty-first to ninetieth working periods with the display data in the thirtieth working period, it is determined that the display data from the thirty-first to ninetieth working periods is the same as the display data in the thirtieth working period. In the thirty-first to ninetieth working periods, the second clock signal may be set to be at a low level. At this time, the output signal C(n)_P and the output signal C(n)_N are not output to the corresponding pixel row, and the pixel row corresponding to the shift register 800 is not refreshed.

In an embodiment of the present disclosure, by setting the timing of the first control circuit 740 and designing the timing of the second clock signal CLK2, a time period of providing the gate driving signal Gate(n)_N and the gate driving signal Gate(n)_P to the pixel array is controlled, so that the refresh rates of different regions in the pixel array may be flexibly controlled, thereby making different regions in the pixel array to refresh at different refresh rates.

Figure 9:
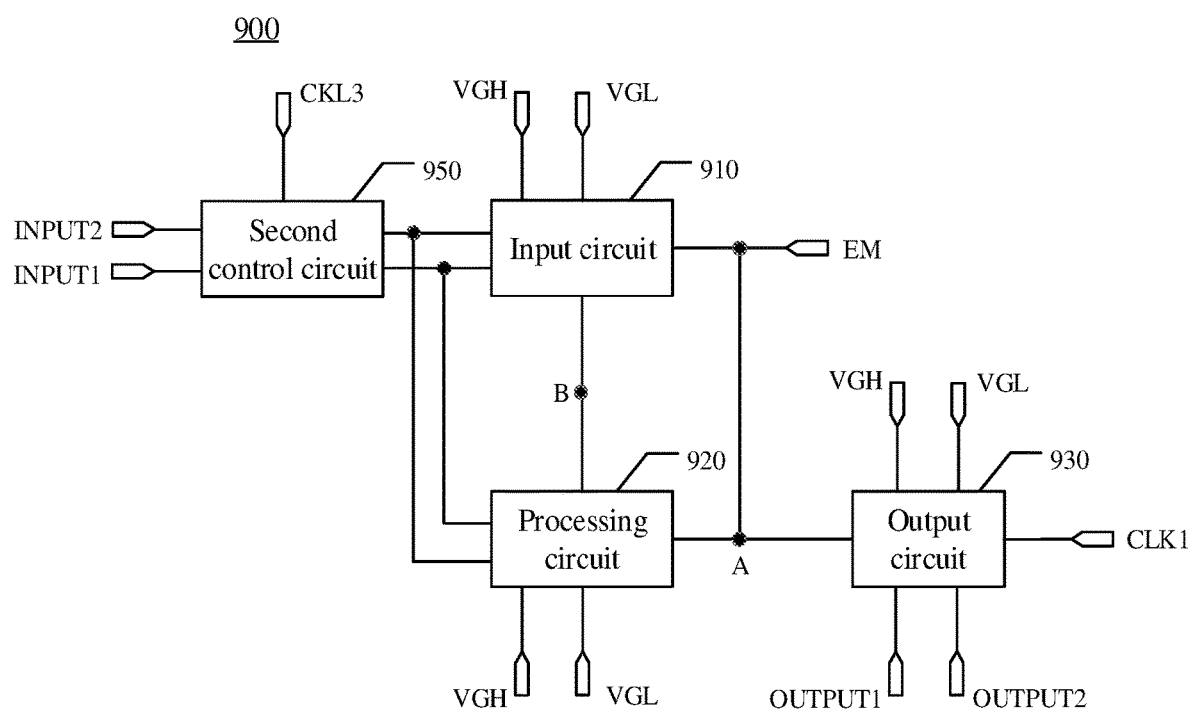
FIG. 9 is a schematic diagram of a structure of a shift register according to another embodiment of the present disclosure.

FIG. 9 is a schematic diagram of a structure of a shift register according to another embodiment of the present disclosure.

As shown in FIG. 9, the shift register 900 includes an input circuit 910, a processing circuit 920, an output circuit 930 and a second control circuit 950. The input circuit 910, the processing circuit 920 and the output circuit 930 are similar to the input circuit 510, the processing circuit 520 and the output circuit 530 mentioned in the previous description. For simplicity, the same parts will not be repeated herein.

In an embodiment of the present disclosure, the second control circuit 950 is electrically connected to a third clock signal terminal CLK3, the input circuit 910, the first input signal terminal INPUT1 and the second input signal terminal INPUT2. The first input signal terminal INPUT1 and the second input signal terminal INPUT2 are electrically connected to the input circuit 910 through the second control circuit 950. For example, the first input signal of the first input signal terminal INPUT1 is provided to the input circuit 910 through the second control circuit 950, and the second input signal of the second input signal terminal INPUT2 is provided to the input circuit 910 through the second control circuit 950.

Under a control of a third clock signal from the third clock signal CLK3, the first input signal and the second input signal are provided to the input circuit 910.

In an embodiment of the present disclosure, the second control circuit 950 includes a first output terminal and a second output terminal, and the input circuit 910 includes a first input terminal and a second input terminal. For example, the first output terminal of the second control circuit 950 is electrically connected to the first input terminal of the input circuit 910, and the second output terminal of the second control circuit 950 is electrically connected to the second input terminal of the input circuit 910. The second control circuit 950 may control to provide one of the first input signal and the second input signal from the first output terminal to the first input terminal of the input circuit 910. The second control circuit 950 may also control to provide one of the first input signal and the second input signal from the second output terminal to the second input terminal of the input circuit 910.

For example, under the control of the third clock signal, the second control circuit 950 may control to provide the first input signal from the first output terminal to the first input terminal of the input circuit 910. The second control circuit 950 may also control to provide the second input signal from the second output terminal to the second input terminal of the input circuit 910. For example, under the control of the third clock signal, the second control circuit 950 may control to provide the second input signal from the first output terminal to the first input terminal of the input circuit 910. The second control circuit 950 may also control to provide the first input signal from the second output terminal to the second input terminal of the input circuit 910.

In an embodiment of the present disclosure, different input signals are input to the input circuit by the control of the third clock signal, thereby performing a forward scanning and reverse scanning on a pixel array by using the plurality of shift registers 900 which are cascaded. For example, the pixel array includes 2000 rows of pixel circuits, and by using the plurality of shift registers 900 which are cascaded to scan in a direction from the first row to the $2000^{th}$ row, the forward scanning may be achieved. By using the plurality of shift registers 900 which are cascaded to scan in a direction from the $2000^{th}$ row to the first row, the reverse scanning may be achieved.

Figure 10A:
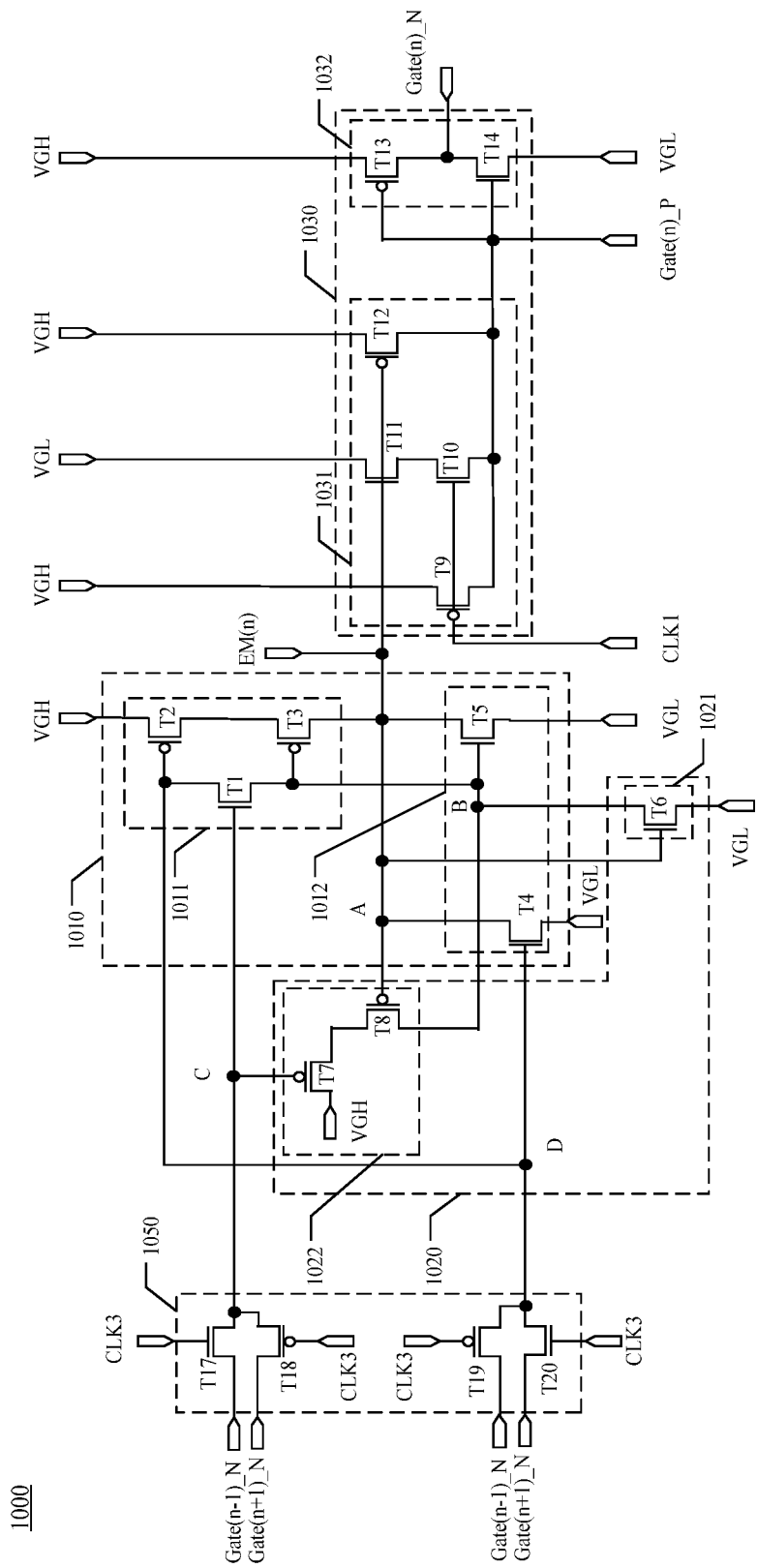
FIG. 10A is a schematic diagram of a structure of a shift register according to another embodiment of the present disclosure.

FIG. 10A is a schematic diagram of a structure of a shift register according to another embodiment of the present disclosure.

As shown in FIG. 10A, the shift register 1000 includes an input circuit 1010, a processing circuit 1020, an output circuit 1030 and a second control circuit 1050.

The input circuit 1010 includes a first input sub-circuit 1011 and a second input sub-circuit 1012. The processing circuit 1020 includes a first processing sub-circuit 1021 and a second processing sub-circuit 1022. The output circuit 1030 includes a first output sub-circuit 1031 and a second output sub-circuit 1032.

The input circuit 1010, the processing circuit 1020, the output circuit 1030 and the second control circuit 1050 are similar to the input circuit 910, the processing circuit 920, the output circuit 930 and the second control circuit 950 mentioned in the previous description, respectively. The first input sub-circuit 1011 and the second input sub-circuit 1012 are similar to the first input sub-circuit 511 and the second input sub-circuit 512 mentioned in the previous description, respectively, The first processing sub-circuit 1021 and the second processing sub-circuit 1022 are similar to the first processing sub-circuit 521 and the second processing sub-circuit 522 mentioned in the previous description, respectively. The first output sub-circuit 1031 and the second output sub-circuit 1032 are similar to the first output sub-circuit 531 and the second output sub-circuit 532 mentioned in the previous description, respectively. For simplicity, the same parts will not be repeated herein.

In an embodiment of the present disclosure, the second control circuit 1050 includes a seventeenth transistor T17, an eighteenth transistor T18, a nineteenth transistor T19 and a twentieth transistor T20. The seventeenth transistor T17, the eighteenth transistor T18, the nineteenth transistor T19 and the twentieth transistor T20 are used as switching transistors, the seventeenth transistor T17 and the twentieth transistor T20 are N-type transistors, and the eighteenth transistor T18 and the nineteenth transistor T19 are P-type transistors.

A gate of the seventeenth transistor T17 is electrically connected to the third clock signal terminal CLK3, a first electrode of the seventeenth transistor T17 is electrically connected to the first input signal terminal Gate(n−1)_N, and a second electrode of the seventeenth transistor T17 and the input circuit 1010 are electrically connected to a third node C. A gate of the eighteenth transistor T18 is electrically connected to the third clock signal terminal CLK3, a first electrode of the eighteenth transistor T18 is electrically connected to the second input signal terminal Gate(n+1)_N, and a second electrode of the eighteenth transistor T18 and the input circuit 1010 are electrically connected to the third node C. A gate of the nineteenth transistor T19 is electrically connected to the third clock signal terminal CLK3, a first electrode of the nineteenth transistor T19 is electrically connected to the first input signal terminal Gate(n−1)_N, and a second electrode of the nineteenth transistor T19 and the input circuit 1010 are electrically connected to a fourth node D. A gate of the twentieth transistor T20 is electrically connected to the third clock signal terminal CLK3, a first electrode of the twentieth transistor T20 is electrically connected to the second input signal terminal Gate(n+1)_N, and a second electrode of the twentieth transistor T20 and the input circuit 1010 are electrically connected to the fourth node D.

In an embodiment of the present disclosure, the second electrode of the seventeenth transistor T17, the gate of the first transistor T1, and the gate of the seventh transistor T7 are electrically connected to the third node C. The second electrode of the eighteenth transistor T18, the gate of the first transistor T1, and the gate of the seventh transistor T7 are electrically connected to the third node C. The second electrode of the nineteenth transistor T19, the gate of the second transistor T2, and the gate of the fourth transistor T4 are electrically connected to the fourth node D. The second electrode of the twentieth transistor T20, the gate of the second transistor T2, and the gate of the fourth transistor T4 are electrically connected to the fourth node D.

In an embodiment of the present disclosure, the first input signal Gate(n−1)_N or the second input signal Gate(n+1)_N is controlled by the seventeenth transistor T17 and the eighteenth transistor T18 to be input to the gate of the first transistor T1 and the gate of the seventh transistor T7. The first input signal Gate(n−1)_N or the second input signal Gate(n+1)_N is controlled by the nineteenth transistor T19 and the twentieth transistor T20 to be input to the gate of the second transistor T2 and the gate of the fourth transistor T4.

Figure 10B:
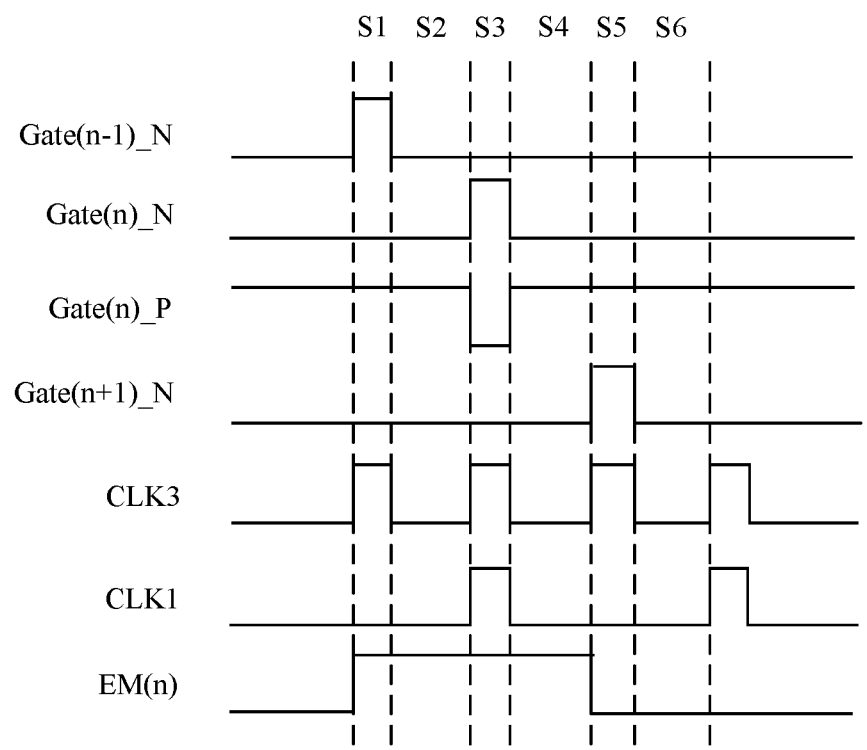
FIG. 10B is a signal timing diagram of the shift register in FIG. 10A.

FIG. 10B is a signal timing diagram of the shift register in FIG. 10A. FIG. 10B shows a timing waveform of each signal in each stage. Taking the structure of the shift register shown in FIG. 10A as an example, with reference to the signal timing diagram shown in FIG. 10B, the working process of the shift register provided in the embodiment of the present disclosure will be described. The working process of the shift register includes 6 stages.

In a first stage S1, the first input signal Gate(n−1)_N is at a high level, the second input signal Gate(n+1)_N is at a low level, the first clock signal CLK1 is at a low level, and the third clock signal CLK3 is at a high level.

Under a control of the third clock signal CLK3, the seventeenth transistor T17 and the twentieth transistor T20 are turned on. The eighteenth transistor T18 and the nineteenth transistor T19 are turned off by the high level of the third clock signal CLK3.

The first input signal Gate(n−1)_N is provided to the gate of the first transistor T1 and the gate of the seventh transistor T7 through the seventeenth transistor T17. The second input signal Gate(n+1)_N is provided to the gate of the third transistor T3 and the gate of the fourth transistor T4 through the twentieth transistor T20.

The working process of the transistors T1 to T14 is the same as that described in FIG. 6A, and for the sake of simplicity, the present disclosure will not be repeated herein.

In a second stage S2, the first input signal Gate(n−1)_N is at a low level, the second input signal Gate(n+1)_N is at a low level, the first clock signal CLK1 is at a low level, and the third clock signal CLK3 is at a low level.

Under the control of the third clock signal CLK3, the eighteenth transistor T18 and the nineteenth transistor T19 are turned on. The seventeenth transistor T17 and the twentieth transistor T20 are turned off by the low level of the third clock signal CLK3.

The first input signal Gate(n−1)_N is provided to the gate of the first transistor T1 and the gate of the seventh transistor T7 through the eighteenth transistor T18. The second input signal Gate(n+1)_N is provided to the gate of the third transistor T3 and the gate of the fourth transistor T4 through the nineteenth transistor T19.

The working process of the transistors T1 to T14 is the same as that described in FIG. 6B, and for the sake of simplicity, the present disclosure will not be repeated herein.

In a third stage S3, the first input signal Gate(n−1)_N is at a low level, the second input signal Gate(n+1)_N is at a low level, the first clock signal CLK1 is at a high level, and the third clock signal CLK3 is at a high level.

Under the control of the third clock signal CLK3, the seventeenth transistor T17 and the twentieth transistor T20 are turned on. The eighteenth transistor T18 and the nineteenth transistor T19 are turned off by the high level of the third clock signal CLK3.

The first input signal Gate(n−1)_N is provided to the gate of the first transistor T1 and the gate of the seventh transistor T7 through the seventeenth transistor T17. The second input signal Gate(n+1)_N is provided to the gate of the third transistor T3 and the gate of the fourth transistor T4 through the twentieth transistor T20.

The working process of the transistors T1 to T14 is the same as that described in FIG. 6C, and for the sake of simplicity, the present disclosure will not be repeated herein.

In a fourth stage S4, the first input signal Gate(n−1)_N is at a low level, the second input signal Gate(n+1)_N is at a low level, the first clock signal CLK1 is at a low level, and the third clock signal CLK3 is at a low level.

Under the control of the third clock signal CLK3, the eighteenth transistor T18 and the nineteenth transistor T19 are turned on. The seventeenth transistor T17 and the twentieth transistor T20 are turned off by the low level of the third clock signal CLK3.

The first input signal Gate(n−1)_N is provided to the gate of the first transistor T1 and the gate of the seventh transistor T7 through the eighteenth transistor T18. The second input signal Gate(n+1)_N is provided to the gate of the third transistor T3 and the gate of the gate of the fourth transistor T4 through the nineteenth transistor T19.

The working process of the transistors T1 to T14 is the same as that described in FIG. 6D, and for the sake of simplicity, the present disclosure will not be repeated herein.

In a fifth stage S5, the first input signal Gate(n−1)_N is at a low level, the second input signal Gate(n+1)_N is at a high level, the first clock signal CLK1 is at a low level, and the third clock signal CLK3 is at a high level.

Under the control of the third clock signal CLK3, the seventeenth transistor T17 and the twentieth transistor T20 are turned on. The eighteenth transistor T18 and the nineteenth transistor T19 are turned off by the high level of the third clock signal CLK3.

The first input signal Gate(n−1)_N is provided to the gate of the first transistor T1 and the gate of the seventh transistor T7 through the seventeenth transistor T17. The second input signal Gate(n+1)_N is provided to the gate of the third transistor T3 and the gate of the fourth transistor T4 through the twentieth transistor T20.

The working process of the transistors T1 to T14 is the same as that described in FIG. 6E, and for the sake of simplicity, the present disclosure will not be repeated herein.

In a sixth stage S6, the first input signal Gate(n−1)_N is at a low level, the second input signal Gate(n+1)_N is at a low level, the first clock signal CLK1 is at a low level, and the third clock signal CLK3 is at a low level.

Under the control of the third clock signal CLK3, the eighteenth transistor T18 and the nineteenth transistor T19 are turned on. The seventeenth transistor T17 and the twentieth transistor T20 are turned off by the low level of the third clock signal CLK3.

The first input signal Gate(n−1)_N is provided to the gate of the first transistor T1 and the gate of the seventh transistor T7 through the eighteenth transistor T18. The second input signal Gate(n+1)_N is provided to the gate of the third transistor T3 and the gate of the fourth transistor T4 through the nineteenth transistor T19.

The working process of the transistors T1 to T14 is the same as that described in FIG. 6D, and for the sake of simplicity, the present disclosure will not be repeated herein.

In an embodiment of the present disclosure, the pixel array is forward scanned through the plurality of shift registers 1000 which are cascaded.

Optionally, a connection relationship between the seventeenth transistor T17, the eighteenth transistor T18, the nineteenth transistor T19, and the twentieth transistor T20 may be modified to achieve the reverse scanning. For example, the connection relationship is modified as: the first electrode of the seventeenth transistor T17 is electrically connected to the second input signal terminal Gate(n+1)_N, the first electrode of the eighteenth transistor T18 is electrically connected to the first input signal terminal Gate(n−1)_N, the first electrode of the nineteenth transistor T19 is electrically connected to the second input signal terminal Gate(n+1)_N, and the first electrode of the twentieth transistor T20 is electrically connected to the first input signal terminal Gate(n−1)_N.

Correspondingly, in the reverse scanning, the timing of the third clock signal CLK3 will also change accordingly. For example, in the first stage S1, the third clock signal CLK3 is at a low level. In the second stage S2, the third clock signal CLK3 is at a high level. In the third stage S3, the third clock signal CLK3 is at a low level. In the fourth stage S4, the third clock signal CLK3 is at a high level. In the fifth stage S5, the third clock signal CLK3 is at a low level. In the sixth stage S6, the third clock signal CLK3 is at a high level.

Figure 11:
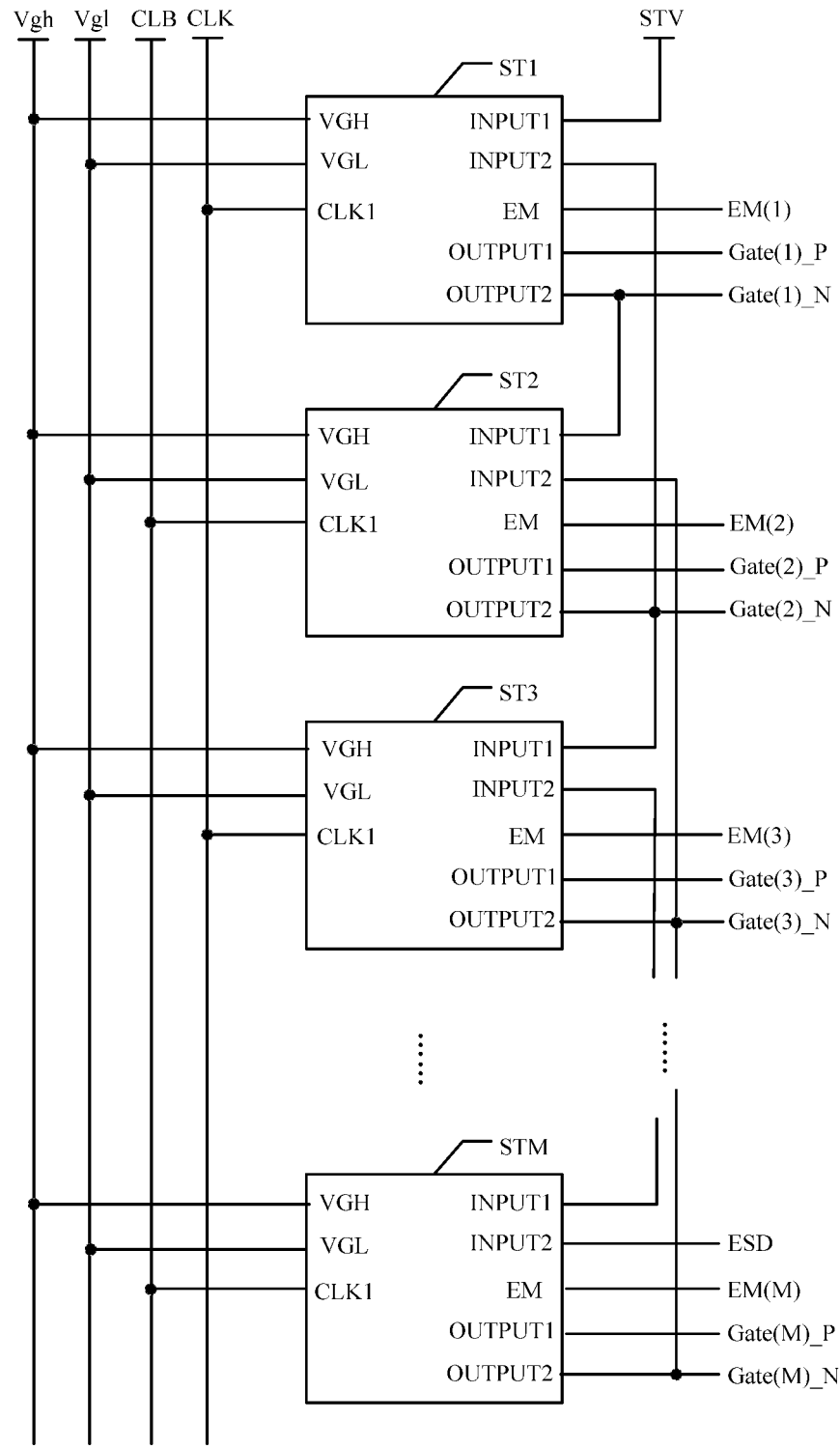
FIG. 11 is a schematic diagram of a structure of a driving circuit according to an embodiment of the present disclosure.

FIG. 11 is a schematic diagram of a structure of a driving circuit according to an embodiment of the present disclosure.

As shown in FIG. 11, the driving circuit 1100 includes M shift registers which are cascaded, where M is a positive integer greater than 1. The M shift registers include a shift register ST1, a shift register ST2, a shift register ST3, . . . , and a shift register STM.

In an embodiment of the present disclosure, the shift register may be any one of the shift registers 300, 400, 500, 700, 800, 900, and 1000 mentioned in the previous description. For example, the M shift registers are all shift registers 300. For example, the M shift registers are all shift registers 500. It will not be repeated herein.

In an embodiment of the present disclosure, among the cascaded M shift registers, a first input signal terminal INPUT1 of an $m^{th}$ shift register is electrically connected to a second scanning output signal terminal OUTPUT2 of an $(m-1)^{th}$ shift register, and a second input signal terminal INPUT2 of the $m^{th}$ shift register is electrically connected to a second scanning output signal terminal OUTPUT2 of an $(m+1)^{th}$ shift register, where $1<m\leq M-1$.

For example, a first input signal terminal INPUT1 of the second shift register ST2 is electrically connected to a second scanning output signal terminal OUTPUT2 of a first shift register ST1, and a second input signal terminal INPUT2 of the second shift register ST2 is electrically connected to a second scanning output signal terminal OUTPUT2 of a third shift register.

For example, the first input signal terminal INPUT1 of the second shift register ST2 receives a gate driving signal Gate(1)_N from the second scanning output signal terminal OUTPUT2 of the first shift register ST1. The second input signal terminal INPUT2 of the second shift register ST2 receives a gate driving signal Gate(3)_N from the second scanning output signal terminal OUTPUT2 of the third shift register ST3. A light-emitting control signal terminal EM(n) of the second shift register ST2 outputs a light-emitting control signal EM(2), the first scanning output signal terminal OUTPUT1 outputs a gate driving signal Gate(2)_P, and the second scanning output signal terminal OUTPUT2 outputs a gate driving signal Gate(2)_N. The second shift register ST2 provides the gate driving signal Gate(2)_N to the second input signal terminal INPUT2 of the first shift register ST1 and the first input signal terminal INPUT1 of the third shift register ST3.

For example, the second input signal terminal INPUT2 of the third shift register ST3 receives the gate driving signal Gate(3)_N from the second scan output signal terminal OUTPUT2 of a next shift register. The first scanning output signal terminal OUTPUT1 of the third shift register ST3 outputs a gate driving signal Gate(3)_P. The second scanning output signal terminal OUTPUT2 outputs the gate driving signal Gate(3)_N.

In an embodiment of the present disclosure, the first input signal terminal INPUT1 of the first shift register ST1 is electrically connected to a scanning trigger signal terminal STV, and a second input signal terminal INPUT2 of an $M^{th}$ shift register STM is electrically connected to an anti-static terminal ESD.

For example, the scanning trigger signal terminal STV inputs a scanning trigger signal STV to the first input signal terminal INPUT1 of the first shift register ST1. Under a control of the scanning trigger signal STV, the second input signal INPUT2, and the first clock signal CLK, a gate driving signal Gate(1)_P is output from the first scanning output signal terminal OUTPUT1. The gate driving signal Gate(1)_N is output from the second scanning output signal terminal OUTPUT2. A light-emitting control signal EM(1) is output from the light-emitting control signal terminal EM(n).

For example, a first input signal terminal INPUT1 of the $M^{th}$ shift register STM receives a gate driving signal Gate(M−1)_N output from a previous shift register. The first scanning output signal terminal OUTPUT1 outputs a gate driving signal Gate(M)_P. A gate driving signal Gate(M)_N is output from the second scanning output signal terminal OUTPUT2, and a light-emitting control signal EM(M) is output from the light-emitting control signal terminal EM(n).

In an embodiment of the present disclosure, the first power supply terminals VGH of the cascaded M shift registers are electrically connected to the power supply terminal Vgh, and the power supply terminal Vgh provides a high potential voltage. The second power supply terminals VGL of the cascaded M shift registers are electrically connected to the power supply terminal Vgl, and the power supply terminal Vgl provides a low potential voltage.

In an embodiment of the present disclosure, the first clock signal terminals CLK1 of the odd numbered shift register units are electrically connected to the clock signal terminal CLK, and receive the clock signal CLK. The first clock signal terminals CLK1 of the even numbered shift register units are electrically connected to the clock signal terminal CLB, and receive the clock signal CLB.

Figure 12:
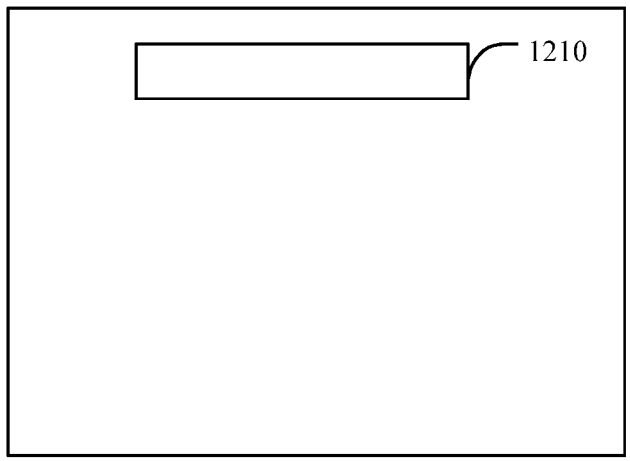
FIG. 12 is a schematic diagram of a structure of a display device according to an embodiment of the present disclosure.

FIG. 12 is a schematic diagram of a structure of a display device according to an embodiment of the present disclosure.

As shown in FIG. 12, the display device 1200 may include a driving circuit 1210.

In an embodiment of the present disclosure, the driving circuit 1210 may be the driving circuit 1100 described in the previous description, which will not be repeated herein.

Figure 13:
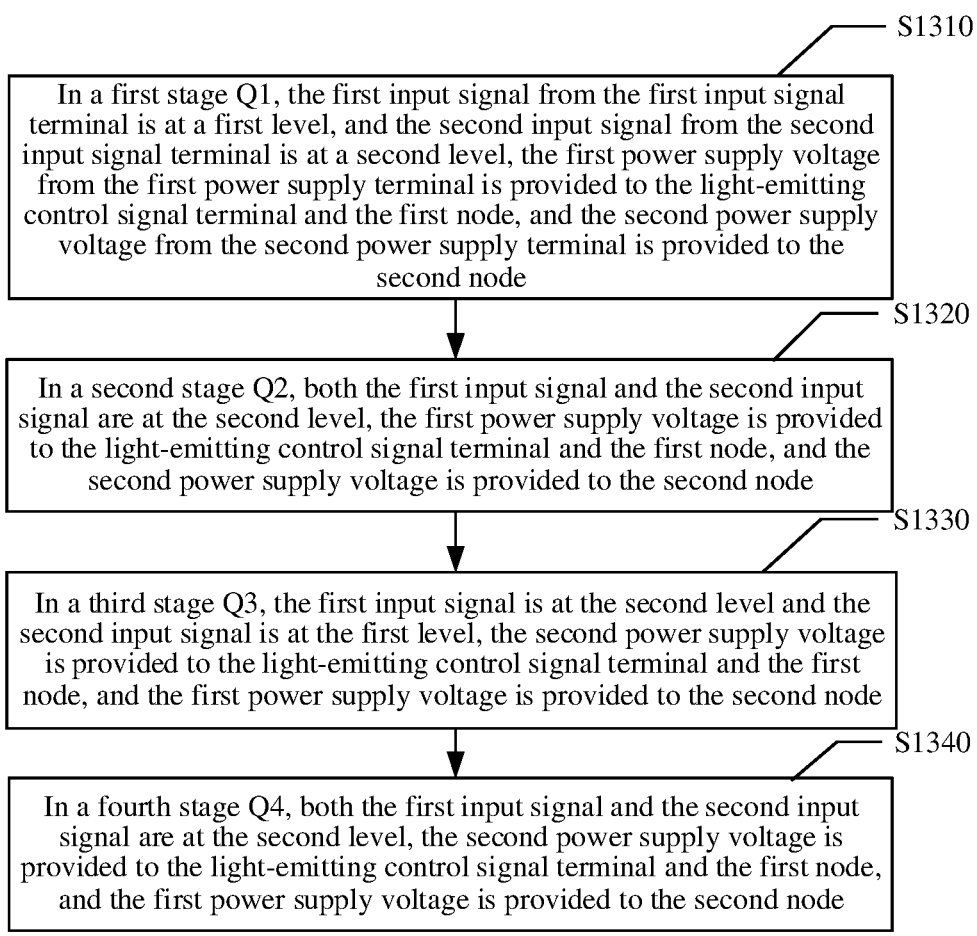
FIG. 13 is a flowchart of a driving method according to an embodiment of the present disclosure.

FIG. 13 is a flowchart of a driving method according to an embodiment of the present disclosure.

As shown in FIG. 13, the driving method may include operation S1310 to operation S1340.

In operation S1310, in a first stage Q1, the first input signal from the first input signal terminal is at a first level, and the second input signal from the second input signal terminal is at a second level. The first power supply voltage from the first power supply terminal is provided to the light-emitting control signal terminal and the first node, and the second power supply voltage from the second power supply terminal is provided to the second node.

In operation S1320, in a second stage Q2, both the first input signal and the second input signal are at the second level. The first power supply voltage is provided to the light-emitting control signal terminal and the first node, and the second power supply voltage is provided to the second node.

In operation S1330, in a third stage Q3, the first input signal is at the second level and the second input signal is at the first level. The second power supply voltage is provided to the light-emitting control signal terminal and the first node, and the first power supply voltage is provided to the second node.

In operation S1340, in a fourth stage Q4, both the first input signal and the second input signal are at the second level. The second power supply voltage is provided to the light-emitting control signal terminal and the first node, and the first power supply voltage is provided to the second node.

In an embodiment of the present disclosure, operation S1310 to operation S1340 are similar to the operations performed by the shift register 500 described in the previous description, and will not be repeated herein.

In an embodiment of the present disclosure, the operation of the first stage Q1 is similar to that of the first stage S1 shown in FIG. 6A, the second stage Q2 includes the operations of the second stage S2 to the fourth stage S4 shown in FIG. 6B to FIG. 6D, the operation of the third stage Q3 is similar to that of the fifth stage S5 shown in FIG. 6E, and the operation of the fourth stage Q4 is similar to that of the sixth stage S6 shown in FIG. 6F. For simplicity, the same parts will not be repeated herein.

In an embodiment of the present disclosure, the first level is a high level and the second level is a low level. Those of skill in the art may also set the first level to a low level and set the second level to a high level according to the type of transistor in the shift register.

For example, in the first stage Q1, the first clock signal from the first clock signal terminal is at the first level, and the first power supply voltage is provided to the first output scanning signal terminal, and the second power supply voltage is provided to the second output scanning signal terminal.

For example, the second stage Q2 includes a first sub-stage Q2_1, a second sub-stage Q2_2 and a third sub-stage Q2_3.

In the first sub-stage Q2_1, the first clock signal from the first clock signal terminal is at the second level. The first power supply voltage is provided to the first output scanning signal terminal, and the second power supply voltage is provided to the second output scanning signal terminal. In the second sub-stage Q2_2, the first clock signal is at the first level, the second power supply voltage is provided to the first output scanning signal terminal, and the first power supply voltage is provided to the second output scanning signal terminal. In the third sub-stage Q2_3, the first power supply voltage is provided to the first output scanning signal terminal, and the second power supply voltage is provided to the second output scanning signal terminal.

The first sub-stage Q2_1 is similar to the operation of the second stage S2 shown in FIG. 6B, the second sub-stage Q2_2 is similar to the operation of the third stage S3 shown in FIG. 6C, and the third sub-stage Q2_3 is similar to the operation of the fourth stage S4 shown in FIG. 6D.

For example, in the third stage Q3, the first clock signal from the first clock signal terminal is at the second level, and the first power supply voltage is provided to the first output scanning signal terminal, and the second power supply voltage is provided to the second output scanning signal terminal.

For example, in the fourth stage Q4, the first clock signal from the first clock signal terminal is at the second level, the first power supply voltage is provided to the first output scanning signal terminal, and the second power supply voltage is provided to the second output scanning signal terminal.

For example, the driving method also includes: in a case that the current display data of the display region driven by the shift register is the same as the previous display data, the second clock signal from the second clock signal terminal is set as the second level; and in a case that current display data in a designated display region driven by the shift register is different from previous display data, the second clock signal is set as the first level; where the display region is the display region in which a pixel row driven by the shift register is located, the current display data is the data displayed by the pixel row driven by the shift register in a current working period, and the previous display data is the multi-frame display data displayed in a plurality of consecutive working periods before the current working period.

For example, the driving method also includes: in the first stage Q1, the third clock signal from the third clock signal terminal is at the first level. In the third stage Q3, the third clock signal is at the first level. In the fourth stage Q4, the third clock signal is at the second level.

In the first sub-stage Q2_1 of the second stage Q2, the third clock signal from the third clock signal terminal is at the second level. In the second sub-stage Q2_2 of the second stage Q2, the third clock signal is at the first level. In the third sub-stage Q2_3 of the second stage Q2, the third clock signal is at the second level.

The flowchart and block diagram in the attached figures show the possible architecture, functions, and operations of the system, methods, and computer program products according to various embodiments of the present disclosure. At this time, each box in a flowchart or block diagram may represent a module, program segment, or part of codes that contains one or more executable instructions for implementing the specified logical function. It should also be noted that in some alternative implementations, the functions indicated in the box may also occur in a different order than those indicated in the accompanying drawings. For example, two consecutive boxes may actually be executed in basic parallel, and sometimes they may also be executed in opposite order, which depend on the functionality involved. It should also be noted that each box in the block diagram or flowchart, and the combination of boxes in the block diagram or flowchart, may be implemented using dedicated hardware based systems that perform specified functions or operations, or may be implemented using a combination of dedicated hardware and computer instructions.

Those of skill in the art may understand that the features recorded in the various embodiments and/or claims of the present disclosure may be combined and/or combined in various ways, even if such combinations or combinations are not explicitly recorded in the present disclosure. Specifically, without departing from the spirit and teachings of the present disclosure, the features recorded in the various embodiments and/or claims of the present disclosure may be combined and/or combined in various ways. All these associations and/or combinations fall within the scope of the present disclosure.

The above describes the embodiments of the present disclosure. However, these embodiments are for illustrative purposes only and are not intended to limit the scope of the present disclosure. Although each embodiment has been described separately above, this does not mean that the measures in each embodiment may not be advantageously combined. The scope of the present disclosure is limited by the attached claims and their equivalents. Without departing from the scope of the present disclosure, those of skill in the art may make various substitutions and modifications, all of which should fall within the scope of the present disclosure.

What is claimed is:

1. A shift register, comprising:
   an input circuit electrically connected to a first input signal terminal, a second input signal terminal, a first power supply terminal, a second power supply terminal, and a light-emitting control signal terminal, and configured to provide a first power supply voltage of the first power supply terminal or a second power supply voltage of the second power supply terminal to a first node under a control of a first input signal from the first input signal terminal and a second input signal from the second input signal terminal, wherein the light-emitting control signal terminal is electrically connected to the first node;
   a processing circuit electrically connected to the first input signal terminal, the first node, the first power supply terminal, and the second power supply terminal, and configured to provide the first power supply voltage or the second power supply voltage to a second node under a control of a potential of the first node and the first input signal, wherein the input circuit is electrically connected to the second node, and the input circuit provides the first power supply voltage or the second power supply voltage to the light-emitting control signal terminal under a control of a potential of the second node; and
   an output circuit electrically connected to a first clock signal terminal, the first node, the first power supply terminal, the second power supply terminal, a first output scanning signal terminal and a second output scanning signal terminal, and configured to provide the first power supply voltage or the second power supply voltage to the first output scanning signal terminal under a control of the potential of the first node and a first clock signal from the first clock signal terminal, and provide the first power supply voltage or the second power supply voltage to the second output scanning signal terminal under a control of a potential of the first output scanning signal terminal.

2. The shift register of claim 1, wherein the input circuit comprises:
   a first input sub-circuit electrically connected to the first input signal terminal, the second input signal terminal, the first power supply terminal and the light-emitting control signal terminal, and configured to provide the first power supply voltage to the light-emitting control signal terminal under the control of the first input signal and the second input signal; and
   a second input sub-circuit electrically connected to the second input signal terminal, the second power supply terminal and the light-emitting control signal terminal, and configured to provide the second power supply voltage to the light-emitting control signal terminal under the control of the second input signal.

3. The shift register of claim 2, wherein the first input sub-circuit comprises a first transistor, a second transistor and a third transistor;
   wherein a control electrode of the first transistor is electrically connected to the first input signal terminal, a first electrode of the first transistor is electrically connected to the second input signal terminal, and a second electrode of the first transistor is electrically connected to a control electrode of the third transistor;
   a control electrode of the second transistor is electrically connected to the second input signal terminal, a first electrode of the second transistor is electrically connected to the first power supply terminal, and a second electrode of the second transistor is electrically connected to a first electrode of the third transistor;
   the control electrode of the third transistor and the second electrode of the first transistor are electrically connected to the second node, and a second electrode of the third transistor and the light-emitting control signal terminal are electrically connected to the first node.

4. The shift register of claim 2, wherein the second input sub-circuit comprises a fourth transistor and a fifth transistor;
   wherein a control electrode of the fourth transistor is electrically connected to the second input signal terminal, a first electrode of the fourth transistor is electrically connected to the second power supply terminal, and a second electrode of the fourth transistor and the light-emitting control signal terminal are electrically connected to the first node; and
   a control electrode of the fifth transistor and the first input sub-circuit are electrically connected to the second node, a first electrode of the fifth transistor is electrically connected to the second power supply terminal, and a second electrode of the fifth transistor and the light-emitting control signal terminal are electrically connected to the first node.

5. The shift register of claim 1, wherein the processing circuit comprises:
a first processing sub-circuit electrically connected to the first node, the second node and the second power supply terminal, and configured to provide the second power supply voltage to the second node under the control of the potential of the first node; and
a second processing sub-circuit electrically connected to the first input signal terminal, the first node, the second node and the first power supply terminal, and configured to provide the first power supply voltage to the second node under the control of the potential of the first node and the first input signal.

6. The shift register of claim 5, wherein the first processing sub-circuit comprises a sixth transistor, wherein a control electrode of the sixth transistor is electrically connected to the first node, a first electrode of the sixth transistor is electrically connected to the second power supply terminal, and a second electrode of the sixth transistor is electrically connected to the second node.

7. The shift register of claim 5, wherein the second processing sub-circuit comprises a seventh transistor and an eighth transistor;
wherein a control electrode of the seventh transistor is electrically connected to the first input signal terminal, a first electrode of the seventh transistor is electrically connected to the first power supply terminal, and a second electrode of the seventh transistor is electrically connected to a first electrode of the eighth transistor; and
a control electrode of the eighth transistor is electrically connected to the first node, and a second electrode of the eighth transistor and the first processing sub-circuit are electrically connected to the second node.

8. The shift register of claim 1, wherein the output circuit comprises:
a first output sub-circuit electrically connected to the first clock signal terminal, the first node, the first power supply terminal, the second power supply terminal and the first output scanning signal terminal, and configured to provide the first power supply voltage or the second power supply voltage to the first output scanning signal terminal under the control of the potential of the first node and the first clock signal; and
a second output sub-circuit electrically connected to the first output scanning signal terminal, the first power supply terminal, the second power supply terminal, and the second output scanning signal terminal, and configured to provide the first power supply voltage or the second power supply voltage to the second output scanning signal terminal under the control of the potential of the first output scanning signal terminal.

9. The shift register of claim 8, wherein the first output sub-circuit comprises a ninth transistor, a tenth transistor, an eleventh transistor and a twelfth transistor;
wherein a control electrode of the ninth transistor is electrically connected to the first clock signal terminal, a first electrode of the ninth transistor is electrically connected to the first power supply terminal, and a second electrode of the ninth transistor is electrically connected to the first output scanning signal terminal;
a control electrode of the tenth transistor is electrically connected to the first clock signal terminal, a first electrode of the tenth transistor is electrically connected to a second electrode of the eleventh transistor, and a second electrode of the tenth transistor is electrically connected to the first output scanning signal terminal;
a control electrode of the eleventh transistor is electrically connected to the first node, and a first electrode of the eleventh transistor is electrically connected to the second power supply terminal; and
a control electrode of the twelfth transistor is electrically connected to the first node, a first electrode of the twelfth transistor is electrically connected to the first power supply terminal, and a second electrode of the twelfth transistor is electrically connected to the first output scanning signal terminal.

10. The shift register of claim 8, wherein the second output sub-circuit comprises a thirteenth transistor and a fourteenth transistor;
wherein a control electrode of the thirteenth transistor is electrically connected to the first output scanning signal terminal, a first electrode of the thirteenth transistor is electrically connected to the first power supply terminal, and a second electrode of the thirteenth transistor is electrically connected to the second output scanning signal terminal; and
a control electrode of the fourteenth transistor is electrically connected to the first output scanning signal terminal, a first electrode of the fourteenth transistor is electrically connected to the second power supply terminal, and a second electrode of the fourteenth transistor is electrically connected to the second output scanning signal terminal.

11. The shift register of claim 1, further comprising:
a first control circuit electrically connected to a second clock signal terminal, the first output scanning signal terminal, the second output scanning signal terminal, a third output scanning signal terminal and a fourth output scanning signal terminal, and configured to provide the potential of the first output scanning signal terminal to the third output scanning signal terminal and provide a potential of the second output scanning signal terminal to the fourth output scanning signal terminal under a control of a second clock signal from the second clock signal terminal.

12. The shift register of claim 11, wherein the first control circuit comprises a fifteenth transistor and a sixteenth transistor;
wherein a control electrode of the fifteenth transistor is electrically connected to the second clock signal terminal, a first electrode of the fifteenth transistor is electrically connected to the second output scanning signal terminal, and a second electrode of the fifteenth transistor is electrically connected to the fourth output scanning signal terminal; and
a control electrode of the sixteenth transistor is electrically connected to the second clock signal terminal, a first electrode of the sixteenth transistor is electrically connected to the first output scanning signal terminal, and a second electrode of the sixteenth transistor is electrically connected to the third output scanning signal terminal.

13. The shift register of claim 1, further comprising:
a second control circuit electrically connected to a third clock signal terminal, the input circuit, the first input signal terminal and the second input signal terminal, and configured to provide the first input signal and the second input signal to the input circuit under a control of a third clock signal from the third clock signal terminal;

wherein the first input signal terminal and the second input signal terminal are electrically connected to the input circuit through the second control circuit.

14. The shift register of claim 13, wherein the second control circuit comprises a seventeenth transistor, an eighteenth transistor, a nineteenth transistor, and a twentieth transistor;

wherein a control electrode of the seventeenth transistor is electrically connected to the third clock signal terminal, a first electrode of the seventeenth transistor is electrically connected to the first input signal terminal, and a second electrode of the seventeenth transistor and the input circuit are electrically connected to a third node;

a control electrode of the eighteenth transistor is electrically connected to the third clock signal terminal, a first electrode of the eighteenth transistor is electrically connected to the second input signal terminal, and a second electrode of the eighteenth transistor and the input circuit are electrically connected to the third node;

a control electrode of the nineteenth transistor is electrically connected to the third clock signal terminal, a first electrode of the nineteenth transistor is electrically connected to the first input signal terminal, and a second electrode of the nineteenth transistor and the input circuit are electrically connected to a fourth node; and a control electrode of the twentieth transistor is electrically connected to the third clock signal terminal, a first electrode of the twentieth transistor is electrically connected to the second input signal terminal, and a second electrode of the twentieth transistor and the input circuit are electrically connected to the fourth node.

15. A driving circuit comprising M shift registers of claim 1, wherein the M shift registers are cascaded and M is a positive integer greater than 1;

a first input signal terminal of an $m^{th}$ shift register among the cascaded M shift registers is electrically connected to a second scanning output signal terminal of an $(m-1)^{th}$ shift register among the cascaded M shift registers, and a second input signal terminal of the $m^{th}$ shift register is electrically connected to a second scanning output signal terminal of an $(m+1)^{th}$ shift register among the cascaded M shift registers, where m is a positive integer, and $1<m\leq M-1$.

16. The driving circuit of claim 15, wherein a first input signal terminal of a first shift register is electrically connected to a scanning trigger signal terminal, and a second input signal terminal of an $M^{th}$ shift register is electrically connected to an anti-static terminal.

17. A display device comprising the driving circuit of claim 15.

18. A driving method applied to the shift register of claim 1, comprising:

in a first stage, in which the first input signal from the first input signal terminal is at a first level and the second input signal from the second input signal terminal is at a second level, providing the first power supply voltage of the first power supply terminal to the light-emitting control signal terminal and the first node, and providing the second power supply voltage of the second power supply terminal to the second node;

in a second stage, in which the first input signal and the second input signal are both at the second level, providing the first power supply voltage to the light-emitting control signal terminal and the first node, and providing the second power supply voltage to the second node;

in a third stage, in which the first input signal is at the second level and the second input signal is at the first level, providing the second power supply voltage to the light-emitting control signal terminal and the first node, and providing the first power supply voltage to the second node; and in a fourth stage, in which the first input signal and the second input signal are both at the second level, providing the second power supply voltage to the light-emitting control signal terminal and the first node, and providing the first power supply voltage to the second node.

19. The driving method of claim 18, further comprising:

in the first stage, in which the first clock signal from the first clock signal terminal is at the first level, providing the first power supply voltage to the first output scanning signal terminal, and providing the second power supply voltage to the second output scanning signal terminal;

in the third stage, in which the first clock signal from the first clock signal terminal is at the second level, providing the first power supply voltage to the first output scanning signal terminal, and providing the second power supply voltage to the second output scanning signal terminal;

in the fourth stage, in which the first clock signal from the first clock signal terminal is at the second level, providing the first power supply voltage to the first output scanning signal terminal, and providing the second power supply voltage to the second output scanning signal terminal;

wherein the second stage comprises a first sub-stage, a second sub-stage and a third sub-stage, and the method further comprising:

in the first sub-stage, in which the first clock signal from the first clock signal terminal is at the second level, providing the first power supply voltage to the first output scanning signal terminal, and providing the second power supply voltage to the second output scanning signal terminal;

in the second sub-stage, in which the first clock signal is at the first level, providing the second power supply voltage to the first output scanning signal terminal, and providing the first power supply voltage to the second output scanning signal terminal; and in the third sub-stage, providing the first power supply voltage to the first output scanning signal terminal, and providing the second power supply voltage to the second output scanning signal terminal.

20. The driving method of claim 19, further comprising:

setting a second clock signal from a second clock signal terminal as the second level, in determining that current display data in a display region driven by the shift register is the same as previous display data; and setting the second clock signal as the first level, in determining that the current display data in a designated display region driven by the shift register is different from the previous display data;

wherein the display region is a display region in which a pixel row driven by the shift register is located, the current display data is data displayed by the pixel row driven by the shift register in a current working period, and the previous display data is multi-frame display data displayed in a plurality of consecutive working periods before the current working period,
wherein in the first stage, a third clock signal from a third clock signal terminal is at the first level;
in the third stage, the third clock signal is at the first level;
in the fourth stage, the third clock signal is at the second level;
in the first sub-stage, the third clock signal from the third clock signal terminal is at the second level;
in the second sub-stage, the third clock signal is at the first level; and
in the third sub-stage, the third clock signal is at the second level.

* * * * *